United States Patent
Vorhaus

(10) Patent No.: US 9,236,378 B2
(45) Date of Patent: Jan. 12, 2016

(54) INTEGRATED SWITCH DEVICES

(71) Applicant: James L. Vorhaus, Chapel Hill, NC (US)

(72) Inventor: James L. Vorhaus, Chapel Hill, NC (US)

(73) Assignee: Sarda Technologies, Inc., Durham, NC (US)

(*) Notice: Subject to any disclaimer, the term of this patent is extended or adjusted under 35 U.S.C. 154(b) by 0 days.

(21) Appl. No.: 14/205,281

(22) Filed: Mar. 11, 2014

(65) Prior Publication Data

US 2014/0191305 A1 Jul. 10, 2014

Related U.S. Application Data

(60) Continuation-in-part of application No. 14/166,795, filed on Jan. 28, 2014, now Pat. No. 8,835,239, which is a division of application No. 13/685,543, filed on Nov. 26, 2012, now Pat. No. 8,653,565, which is a continuation-in-part of application No. 13/441,664, filed on Apr. 6, 2012, now Pat. No. 8,541,271, which is a continuation of application No. 13/270,145, filed on Oct. 10, 2011, now Pat. No. 8,274,121, which is a continuation of application No. 13/205,433, filed on Aug. 8, 2011, now Pat. No. 8,519,916.

(60) Provisional application No. 61/372,513, filed on Aug. 11, 2010, provisional application No. 61/780,282, filed on Mar. 13, 2013.

(51) Int. Cl.
| | |
|---|---|
| *H01L 21/336* | (2006.01) |
| *H01L 27/088* | (2006.01) |
| *H01L 27/02* | (2006.01) |
| *H01L 27/06* | (2006.01) |

(52) U.S. Cl.
CPC .......... *H01L 27/088* (2013.01); *H01L 27/0266* (2013.01); *H01L 27/0605* (2013.01)

(58) Field of Classification Search
USPC ......... 257/213, 202, 288, 341, 401, 205, 206, 257/207, 208, 209, 210, 211, 287, 292, 390, 257/284, 289, 279, 624, E29.143, E21.046, 257/E21.062, E29.108, E51.005, E29.13, 257/E29.137
See application file for complete search history.

(56) References Cited

U.S. PATENT DOCUMENTS

| | | |
|---|---|---|
| 4,636,825 A | 1/1987 | Baynes |
| 5,091,817 A | 2/1992 | Alley et al. |
| 5,227,781 A | 7/1993 | Ninnis |
| 5,258,638 A | 11/1993 | Elhatem et al. |
| 5,289,040 A | 2/1994 | Rogers |
| 5,298,851 A | 3/1994 | DeNardis |
| 5,495,165 A | 2/1996 | Beland |
| 5,714,809 A | 2/1998 | Clemo |

(Continued)

*Primary Examiner* — Timor Karimy
(74) *Attorney, Agent, or Firm* — Carr & Ferrell LLP

(57) ABSTRACT

Various aspects of the technology include an integrated circuit device comprising a compound semiconductor layer and a plurality of input, switch, and ground ohmic metal fingers fabricated on the compound semiconductor layer in a repeating sequence. A control gate may be disposed between each input finger and adjacent switch finger, and a sync gate may be disposed between each ground finger and adjacent switch finger. A sync gate and a control gate may be disposed adjacent each switch finger. The device further includes a plurality of control gate pads, each control gate pad at an end of two control gates, and a control gate pad at opposite ends of each control gate, and a plurality of sync gate pads, each sync gate pad at an end of two sync gates, and a sync gate pad at opposite ends of each sync gate.

14 Claims, 26 Drawing Sheets

(56) References Cited

U.S. PATENT DOCUMENTS

| | | |
|---|---|---|
| 5,721,144 A | 2/1998 | Hsieh et al. |
| 5,786,685 A | 7/1998 | Lange et al. |
| 5,789,791 A | 8/1998 | Bergemont |
| 5,801,091 A | 9/1998 | Efland et al. |
| 5,815,356 A | 9/1998 | Rodriguez et al. |
| 5,955,763 A | 9/1999 | Lin |
| 6,292,046 B1 | 9/2001 | Ali |
| 6,424,006 B1 | 7/2002 | Ponse |
| 6,900,482 B2 | 5/2005 | Aoki et al. |
| 7,132,717 B2 | 11/2006 | Su et al. |
| 7,157,959 B2 | 1/2007 | Ball et al. |
| 7,251,178 B2 | 7/2007 | Gogl et al. |
| 7,313,006 B2 | 12/2007 | Choi |
| 7,560,346 B2 | 7/2009 | Igarashi |
| 7,952,117 B2 | 5/2011 | Masuda |
| 8,008,960 B2 | 8/2011 | Arduini |
| 8,064,179 B2 | 11/2011 | Apfel |
| 8,097,906 B2 | 1/2012 | Takagi |
| 8,203,372 B2 | 6/2012 | Arduini |
| 8,274,121 B2 | 9/2012 | Vorhaus |
| 8,339,055 B2 | 12/2012 | Zhan et al. |
| 8,344,463 B2 * | 1/2013 | Yanagihara et al. .......... 257/401 |
| 8,344,464 B2 | 1/2013 | Cho |
| 8,426,952 B2 | 4/2013 | Cho et al. |
| 8,497,574 B2 | 7/2013 | Cho et al. |
| 8,513,707 B2 | 8/2013 | Herberholz |
| 8,519,916 B2 | 8/2013 | Vorhaus |
| 8,541,271 B1 | 9/2013 | Vorhaus |
| 8,569,811 B1 | 10/2013 | Vorhaus et al. |
| 8,575,621 B1 | 11/2013 | Vorhaus |
| 8,637,909 B1 | 1/2014 | Vorhaus |
| 8,653,565 B1 | 2/2014 | Vorhaus |
| 8,759,924 B1 | 6/2014 | Vorhaus |
| 8,835,239 B1 | 9/2014 | Vorhaus |
| 8,896,034 B1 | 11/2014 | Vorhaus |
| 8,952,424 B2 | 2/2015 | Herberholz |
| 9,006,799 B2 | 4/2015 | Vorhaus |
| 9,136,265 B2 | 9/2015 | Vorhaus |
| 2002/0014670 A1 | 2/2002 | Litwin |
| 2002/0142554 A1 | 10/2002 | Nakajima |
| 2004/0164407 A1 | 8/2004 | Nakajima et al. |
| 2007/0200803 A1 | 8/2007 | Kimura |
| 2007/0228424 A1 | 10/2007 | Igarashi |
| 2007/0236424 A1 | 10/2007 | Kimura |
| 2009/0050900 A1 | 2/2009 | Masuda |
| 2009/0065810 A1 | 3/2009 | Honea et al. |
| 2009/0095989 A1 * | 4/2009 | Kim .......................... 257/259 |
| 2010/0171685 A1 | 7/2010 | Kimura |
| 2012/0032606 A1 | 2/2012 | Fukumoto et al. |
| 2012/0037917 A1 | 2/2012 | Vorhaus |
| 2012/0086497 A1 | 4/2012 | Vorhaus |
| 2012/0099357 A1 | 4/2012 | Morita |
| 2012/0267795 A1 | 10/2012 | Shimura |
| 2013/0043487 A1 | 2/2013 | Liu et al. |
| 2015/0054091 A1 | 2/2015 | Vorhaus |
| 2015/0171080 A1 | 6/2015 | Vorhaus |

\* cited by examiner

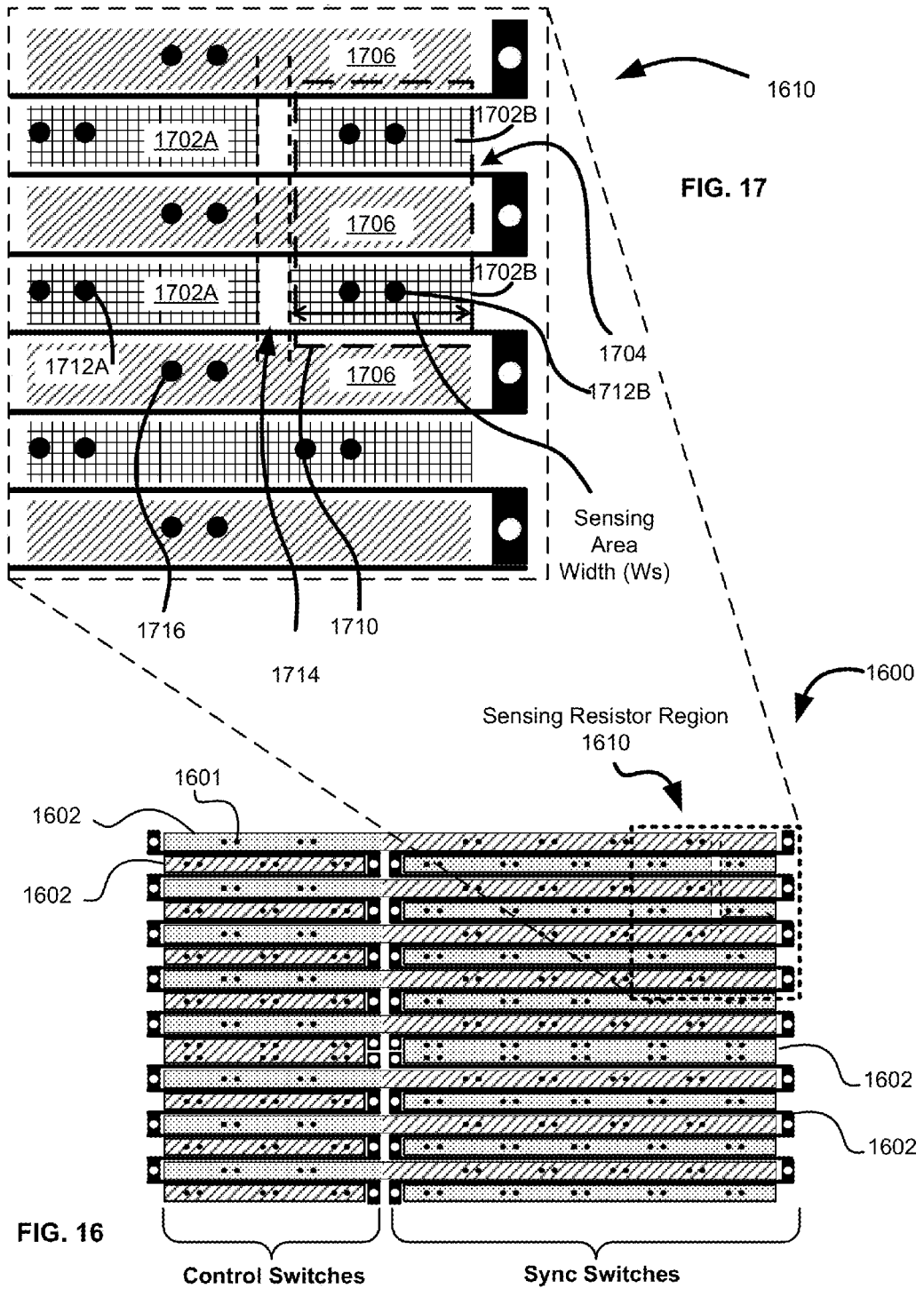

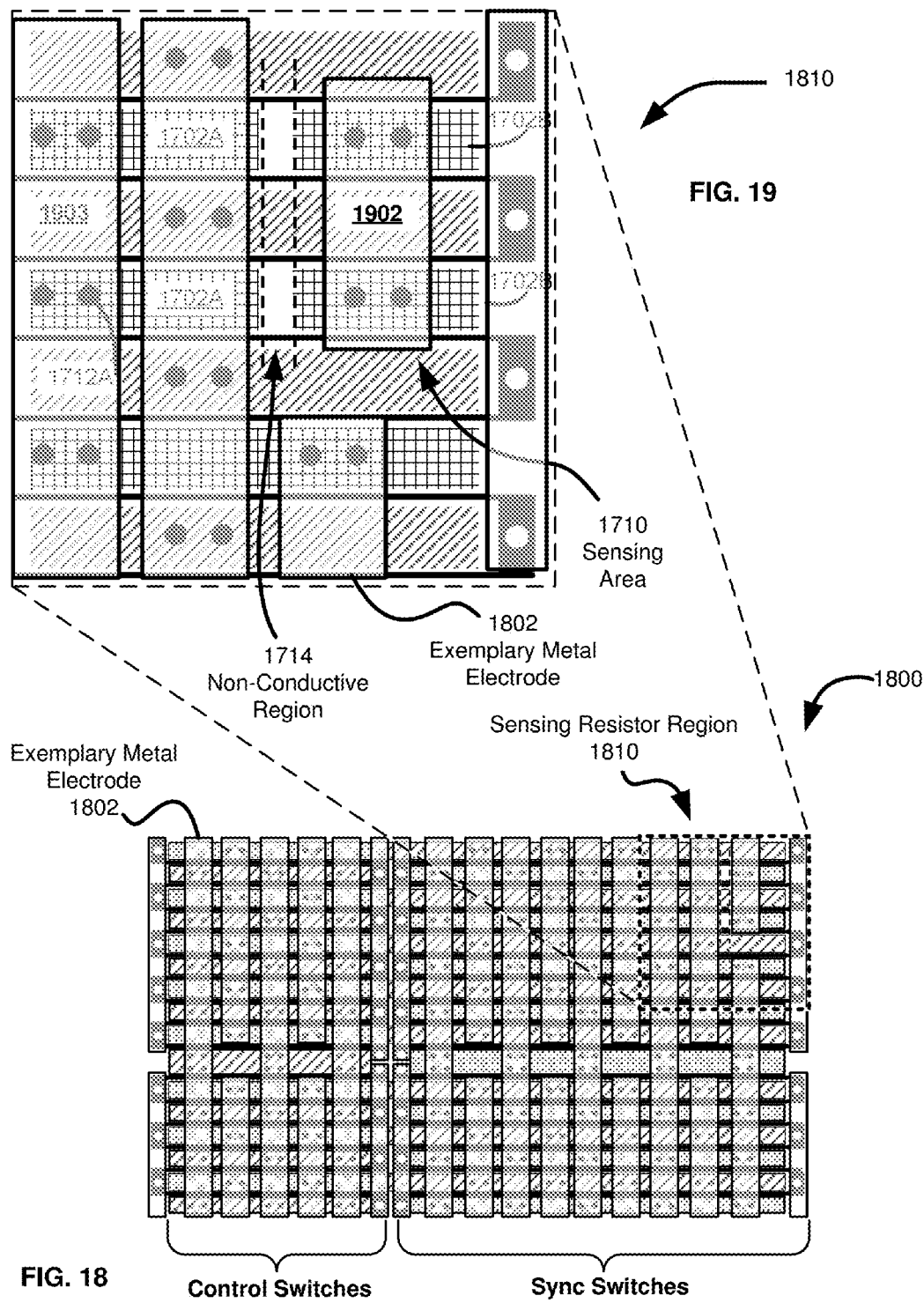

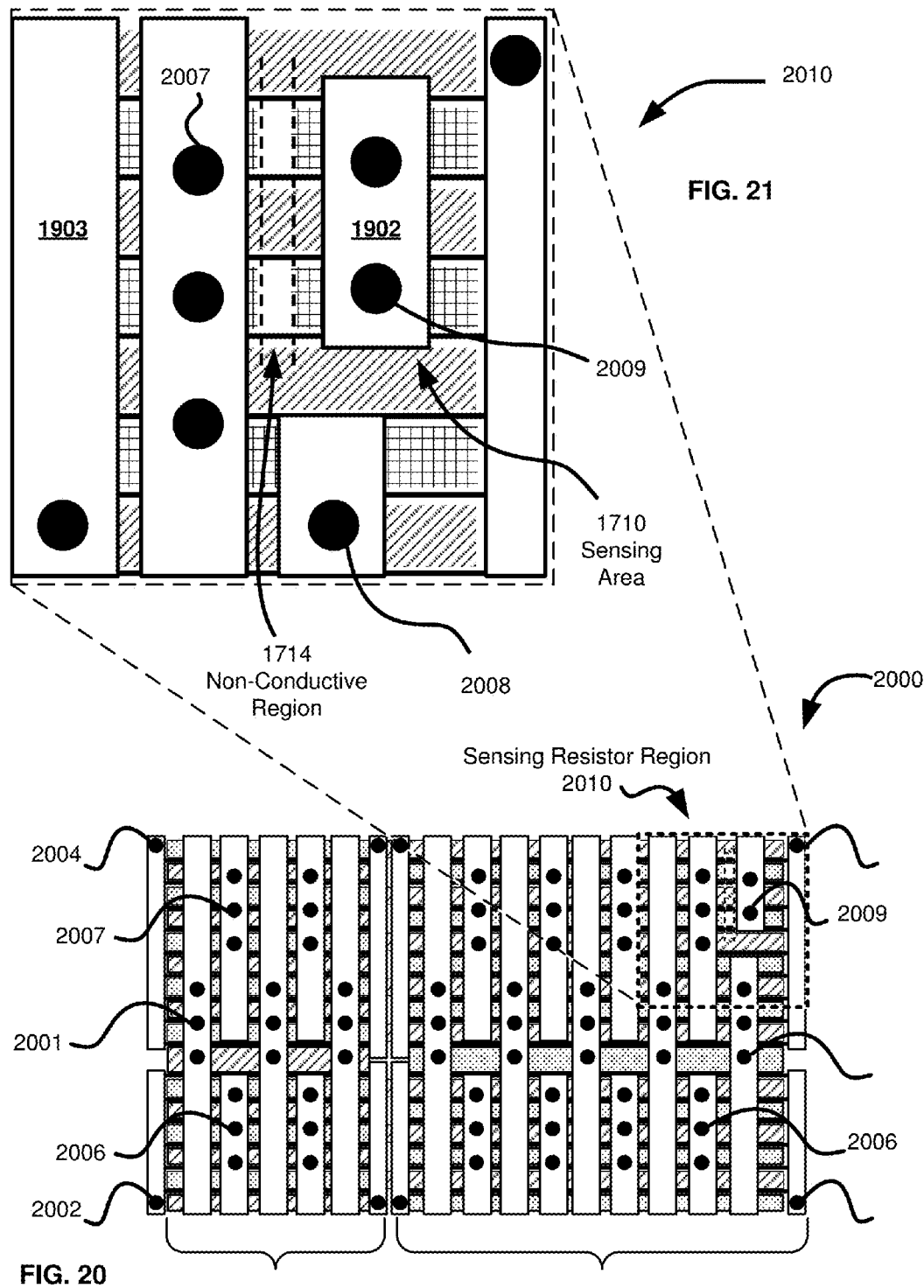

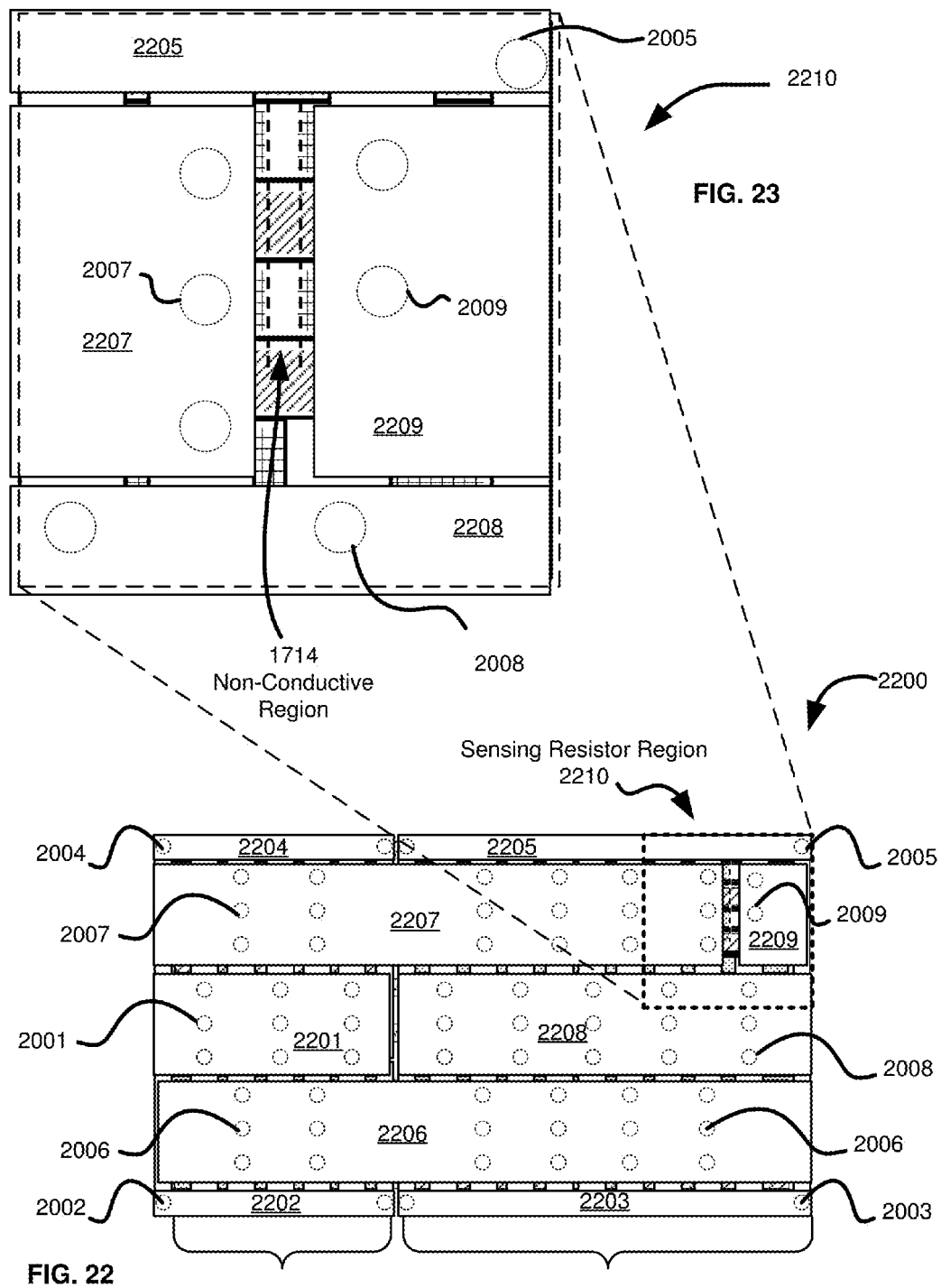

INTEGRATED SWITCH DEVICES

CROSS REFERENCE TO RELATED APPLICATIONS

This application claims the priority benefit of U.S. provisional patent application No. 61/780,282, filed Mar. 13, 2013, and titled "Integrated Switch Devices."
This application is also a continuation-in-part of, and claims the priority benefit of, U.S. patent application Ser. No. 14/166,795, filed Jan. 28, 2014, and titled, "Mixed Mode Multiple Switch Integration of Multiple Compound Semiconductor FET Devices," issued Sep. 16, 2014 as U.S. Pat. No. 8,835,239, which is a divisional of, and claims the priority benefit of, U.S. patent application Ser. No. 13/685,543, filed Nov. 26, 2012, and titled "Mixed Mode Multiple Switch Intgration of Multiple Compound Semiconductor FET Devices," issued Feb. 18, 2014 as U.S. Pat. No. 8,653,565, which is a continuation-in-part of, and claims the priority benefit of, U.S. patent application Ser. No. 13/441,644, filed Apr. 6, 2012, and titled, "Monolithic Integration Of Multiple Compound Semiconductor FET Devices," issued Sep. 24, 2013 as U.S. Pat. No. 8,541,271,
which is a continuation of, and claims the priority benefit of U.S. patent application Ser. No. 13/270,145, filed Oct. 10, 2011, and titled, "Compound Field Effect Transistor with Multi-Feed Gate and Serpentine Interconnect," issued Sep. 25, 2012 as U.S. Pat. No. 8,274,121,
which is continuation of, and claims the priority benefit of U.S. patent application Ser. No. 13/205,433, filed Aug. 8, 2011, and titled, "Low Interconnect Resistance Integrated Switches," issued on Aug. 27, 2013 as U.S. Pat. No. 8,519, 916, which in turn claims the priority benefit of U.S. provisional patent application No. 61/372,513, filed Aug. 11, 2010, and titled "Field Effect Transistor and Method of Making Same." All of the above referenced applications are hereby incorporated by reference in their entirety.

TECHNICAL FIELD

The present invention relates to semiconductor devices, and more particularly to compound semiconductor Field Effect Transistor switches and power FETs.

BACKGROUND

FIG. 1A illustrates a prior art dc-dc converter circuit 100. In such a buck converter circuit 100 there are two switch devices, which are known as the control (or high side) FET 104 and the sync (or low side) FET 105. As can be seen in the diagram, the control FET's source terminal is connected directly to the sync FET's drain terminal at node 102. A voltage source provides current at $V_{in}$ 101. The node 102 between the two devices (known as the switching node) is also connected to the converter's output through an LC network comprising an inductor 106 and a capacitor 107. $V_{in}$ 101 and $V_{out}$ 108 are referenced to ground 103. A driver 109 provides control for switching the control FET 104 and sync FET 105 on and off.

Conventionally high-current (>~1 amp) output converters use silicon MOSFET devices such as depicted in FIG. 1A for the switches 104 and 105. These MOSFETs are vertical devices; that is the current flows through the bulk between the drain contact (which is conventionally located on the top surface of the die) and the source contact on the opposite surface when the switch 104 and/or 105 is in its on state. Because of this vertical current flow, the control FET device 104 and the sync FET device 105 are on separate die. This then means that a bottom surface of the control FET die 104 must be electrically connected to a top surface of the sync FET die 105, and, at the same time, connected to the inductor 106 that goes to the converter output 108 across a load R. In addition, since heat is generated in the bulk of the device, both surfaces are normally heat sunk to minimize the temperature rise. These requirements lead to a relatively complex packaging problem.

SUMMARY

In various aspects, a multiple Field Effect Transistor (FET) device includes a compound semiconductor layer, a sync FET, a control FET including a plurality of first control ohmic metal fingers and second control ohmic metal fingers, and an e-mode FET configured as a normally off component to protect the control FET upon power up of the device, the control FET, sync FET and e-mode FET fabricated on the compound semiconductor layer as of the monolithic device.

In some embodiments, e-mode protection FET of the multiple FET includes a plurality of first and second e-mode ohmic metal fingers, each of the first ohmic metal fingers contiguous with a first control ohmic metal finger of the control FET, an e-mode gate finger disposed between each adjacent first e-mode ohmic metal finger and second e-mode ohmic metal finger, and for each of the second e-mode ohmic metal fingers, an e-mode gate pad and a control gate pad disposed between the second e-mode ohmic metal fingers and a second control ohmic metal finger, the second control ohmic metal finger aligned with the second e-mode ohmic metal finger, each e-mode gate pad at an end of two e-mode gate fingers.

Various aspects of a multiple Field Effect Transistor (FET) device includes a compound semiconductor layer, a sync and control FET fabricated on the compound semiconductor layer, the sync FET including a first and second sync ohmic metal finger, and a sense area. In various embodiments, the sense area includes a first sense ohmic metal finger parallel to and aligned with the first sync ohmic metal finger, a second sense ohmic metal finger contiguous with the second sync ohmic metal finger, and a non-conductive region disposed between the first sense ohmic metal finger and the first sync ohmic metal finger. A continuous sync gate finger may be disposed adjacent the first and second sense ohmic metal finger and between the first and second sync ohmic metal finger.

Various aspects of a Field Effect Transistor device include a compound semiconductor layer on which is fabricated a plurality of ohmic metal fingers in a repeating pattern including a sequence of an input finger, a switch finger, a ground finger referenced to a ground, a switch finger, and an input finger. The layer further includes a control gate disposed between each input finger and adjacent switch finger and a sync gate disposed between each ground finger and adjacent switch finger, a sync gate and a control gate adjacent each switch finger. A plurality of control gate pads may each be disposed at an end of two control gates. A control gate pad may be disposed at opposite ends of each control gate. A plurality of sync gate pads may each disposed at an end of two sync gates, and a sync gate pad may be disposed at opposite ends of each sync gate.

Various aspects of a device includes a package substrate, a die embedded in the package substrate, a decoupling capacitor mounted directly above the die embedded in the package substrate, and an organic layer disposed between the die and the decoupling capacitor.

In various embodiments, a dual Field Effect Transistor device includes a compound semiconductor layer and a plurality of segments fabricated on the compound semiconductor layer, each segment comprising a first and second sync ohmic metal finger, a first and second control ohmic metal finger, and a first switch metal finger disposed between the first sync ohmic metal finger and the first control ohmic metal finger. Each segment further comprises a second switch metal finger disposed between the first control ohmic metal finger and the second sync ohmic metal finger. Each segment also comprises a third switch metal finger disposed between the second sync ohmic metal finger and the second control ohmic metal finger. Each segment further comprises a fourth switch metal finger, the second control ohmic metal finger disposed between the fourth switch metal finger and the third switch metal finger and a first sync gate finger disposed between the first sync ohmic metal finger and the first switch metal finger, a first and second sync gate pad on opposite ends of the first sync gate finger. Each segment further includes a first and second control gate finger disposed between the first control ohmic metal finger and the first and second switch metal fingers, respectively, a second and third sync gate finger disposed between the second sync ohmic metal finger and the second and third switch metal fingers, respectively, and a third and fourth control gate finger disposed between the second control ohmic metal finger and the third and fourth switch metal fingers, respectively. Each also includes a first and second control gate pad in electrical contact on opposite ends of the first control gate finger, the second and a third control gate pad in electrical contact on opposite ends of the second control gate finger, the third and a fourth control gate pad in electrical contact on opposite ends of the third control gate pad, and the fourth and a fifth control gate pad in electrical contact on opposite ends of the fourth control gate pad; and a first and second sync gate pad in electrical contact on opposite ends of the first sync gate finger, the second and a third sync gate pad in electrical contact on opposite ends of the second sync gate finger, the third and a fourth sync gate pad in electrical contact on opposite ends of the third sync gate pad, and the fourth and a fifth sync gate pad in electrical contact on opposite ends of the fourth sync gate pad.

Various aspects of a multiple Field Effect Transistor (FET) device includes a compound semiconductor layer, and a first and second control FET fabricated on the compound semiconductor layer as segments of a monolithic device. In various embodiments, the control FET segment includes a first and second ohmic metal finger, a control gate finger between the first and second ohmic metal fingers, and a first and second control gate pad at opposite ends of the control gate finger and in electrical contact with the control gate finger. In some embodiments, the FET device further includes a transition control ohmic metal finger between the first control FET and the second control FET; a first transition control gate finger disposed between the transition control ohmic metal finger and the first ohmic metal finger of the first control FET and in electrical contact with the control gate finger between the first and second ohmic metal fingers of the first control FET; and a second transition control gate finger between the transition control ohmic metal finger and the first ohmic metal finger of the second control FET and in electrical contact with the control gate finger between the first and second ohmic metal fingers of the second control FET, the first transition control gate finger electrically isolated from the second transition control gate finger. The FET device may also include a first and second sync FET fabricated on the compound semiconductor layer as segments of the monolithic device. In various embodiments, each sync FET segment includes a first and second ohmic metal finger, a sync gate finger between the first and second ohmic metal fingers, and a first and second sync gate pad at opposite ends of the sync gate finger and in electrical contact with the sync gate finger. The FET device may further include a transition sync ohmic metal finger between the first sync FET and the second sync FET; a first transition sync gate finger between the transition sync ohmic metal finger and the first ohmic metal finger of the first sync FET and in electrical contact with the sync gate finger between the first and second ohmic metal fingers of the first sync FET; and a second transition sync gate finger between the transition sync ohmic metal finger and the first ohmic metal finger of the second sync FET and in electrical contact with the sync gate finger between the first and second ohmic metal fingers of the second sync FET, the first transition sync gate finger electrically isolated from the second transition sync gate finger.

In some embodiments, the FET device includes an e-mode protection FET fabricated on the compound semiconductor layer as a segment of a monolithic device. The e-mode protection FET segment may include a first and second e-mode ohmic metal finger, a transition e-mode ohmic metal finger between the first and second ohmic metal finger and contiguous with the transition control ohmic metal finger. In some embodiments, the e-mode protection FET segment also includes a first e-mode gate finger between the first e-mode ohmic metal finger and the transition e-mode ohmic metal finger; a first and second e-mode gate pad at opposite ends of the first e-mode gate finger and in electrical contact with the first e-mode gate finger, the first e-mode gate pad disposed between the first e-mode ohmic metal finger and the first ohmic metal finger of the first control FET; a second e-mode gate finger between the second ohmic metal finger and the transition e-mode metal finger and in electrical contact with the second e-mode gate pad; and a third e-mode gate pad at an opposite end of the second e-mode gate finger from the second e-mode gate pad and in electrical contact with the second e-mode gate finger, the third e-mode gate pad disposed between the second e-mode ohmic metal finger and first ohmic metal finger of the second control FET.

Various aspects of a dual Field Effect Transistor (FET) device includes a compound semiconductor layer and a control FET fabricated on the compound semiconductor layer, the control FET including a source region, a drain region and a gate region. In various embodiments, the control FET further includes an ohmic metal control source finger and an ohmic metal control drain finger disposed on a surface of the compound semiconductor layer in electrical contact with the source region and drain region, respectively, a control gate finger between the control source finger and the control drain finger, and a first and second control gate pad at opposite ends of the control gate finger and in electrical contact with the control gate finger.

The dual FET device further includes a sync FET fabricated on the compound semiconductor layer with the control FET as a monolithic device, the sync FET including a source region, a drain region and a gate region. The sync FET further includes an ohmic metal sync source finger and an ohmic metal sync drain finger disposed on the surface of the compound semiconductor layer in electrical contact with the source region and drain region, respectively, a sync gate finger between the sync source finger and the sync drain finger, and a first and second sync gate pad at opposite ends of the sync gate finger and in electrical contact with the sync gate finger, the first control gate pad and the first sync gate pad disposed between the control drain finger and the sync source finger.

The dual FET device further includes an electrical connection between the control source finger and the sync drain finger; and a sense resistor. The sense resistor includes an isolated portion of the sync finger; a non-conductive region of the sync gate finger configured to electrically isolate the isolated portion of the sync finger from the rest of the sync finger and a portion of the sync drain finger adjacent the isolated portion of the sync gate finger.

BRIEF DESCRIPTION OF THE DRAWINGS

Certain embodiments of the present technology are illustrated by the accompanying figures. It will be understood that the figures are not necessarily to scale and that details not necessary for an understanding of the technology or that render other details difficult to perceive may be omitted. It will be understood that the technology is not necessarily limited to the particular embodiments illustrated herein.

FIG. 16 illustrates first level via layer, which is an alternative embodiment of the first level metal layer for a dual phase gFET™ switch fabric of a dual phase gFET™ device of FIG. 15B, in accordance with aspects of the technology. FIG. 17 is an enlargement of a sensing resistor region in FIG. 16.

FIG. 18. Illustrates a first level metal layer for the dual phase gFET™ switch fabric with sensing resistor region.

FIG. 19 is an enlargement of a sensing resistor region in FIG. 18.

FIG. 20 illustrates a second level via layer of the dual phase gFET™ switch fabric with sensing resistor region.

FIG. 21 is an enlargement of a sensing resistor region in FIG. 20.

FIG. 22 illustrates a second level metal layer of the dual phase gFET™ switch fabric with sensing resistor.

FIG. 23 is an enlargement of a sensing resistor region in FIG. 22.

DETAILED DESCRIPTION

Figure 1A:
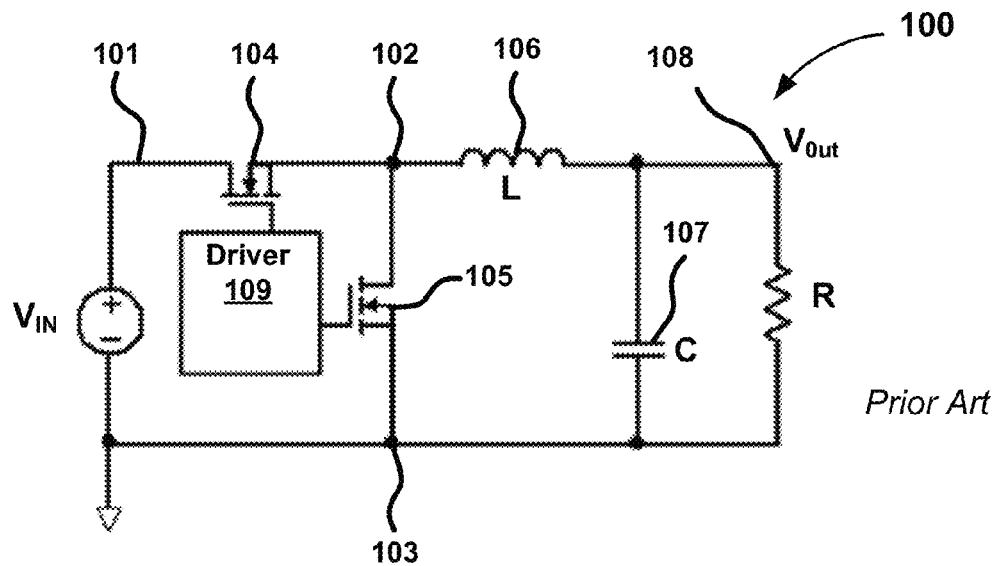
FIG. 1A illustrates a conventional dc-dc converter circuit.

While this technology is susceptible of embodiment in many different forms, there is shown in the drawings and will herein be described in detail several specific embodiments with the understanding that the present disclosure is to be considered as an exemplification of the principles of the technology and is not intended to limit the technology to the embodiments illustrated.

The terminology used herein is for the purpose of describing particular embodiments only and is not intended to be limiting of the present technology. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that like or analogous elements and/or components, referred to herein, may be identified throughout the drawings with like reference characters. It will be further understood that several of the figures are merely schematic representations of the present technology. As such, some of the components may have been distorted from their actual scale for pictorial clarity.

In some embodiments a dual switch may be configured as a fully integrated dual switch. As described in another invention, gFET™ technology may be used to integrate the devices FET 104 and 105 of FIG. 1A monolithically (in the same device) such that all five electrical contacts shown in FIG. 1A may be accessed from a top surface of the device. See, e.g., U.S. patent application Ser. No. 13/441,644, filed Apr. 6, 2012, titled "Monolithic Integration Of Multiple Compound Semiconductor FET Devices" (now U.S. Pat. No. 8,541,271, issued Sep. 24, 2013), and U.S. patent application Ser. No. 13/685,543, filed Nov. 26, 2012, titled "Mixed Mode Multiple Switch Integration of Multiple Compound Semiconductor FET Devices" (now U.S. Pat. No. 8,653,565 issued on Feb. 18, 2014), both applications incorporated herein in their entirety. The present application discloses additional embodiments for integrating FET devices.

Figure 1B:
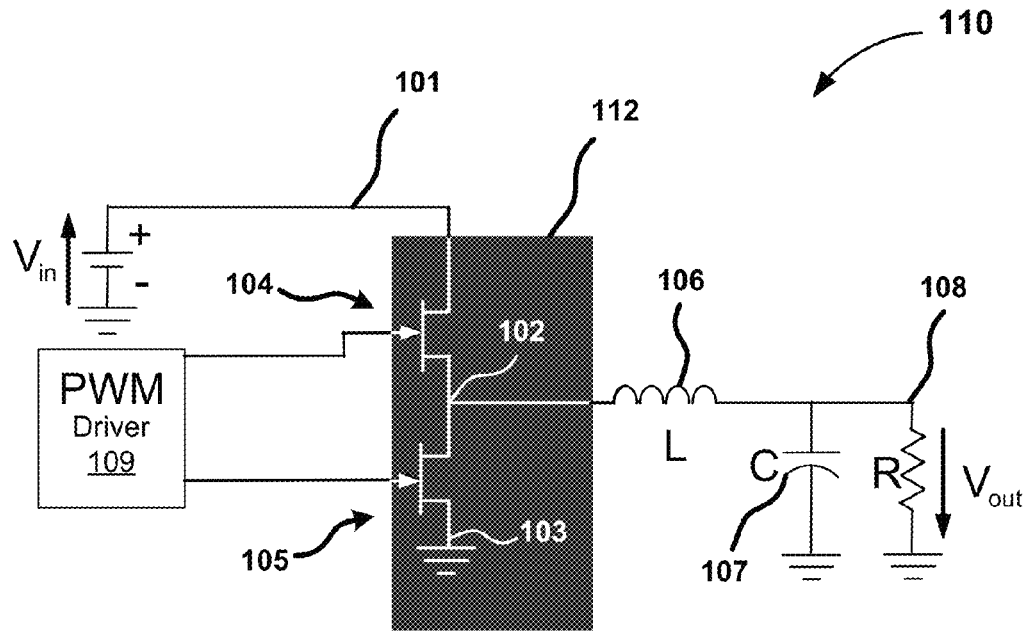
FIG. 1B is a circuit diagram illustrating an embodiment for using a control/sync FET pair including a pair of devices comprising a control FET and a sync FET both integrated monolithically in the same die.

FIG. 1B is a circuit diagram 110 illustrating an embodiment for using a control/sync FET pair including a pair of devices comprising a control FET 104 and a sync FET 105 both integrated monolithically in the same device 112. In the circuit 110 illustrated by FIG. 1B both the control FET 104 and the sync FET 105 of the control/sync FET converter circuit pair can be realized on a single chip represented by the dark box 112. For example, the circuit of FIG. 1B may be fabricated using gFET™ technology.

Figure 2:
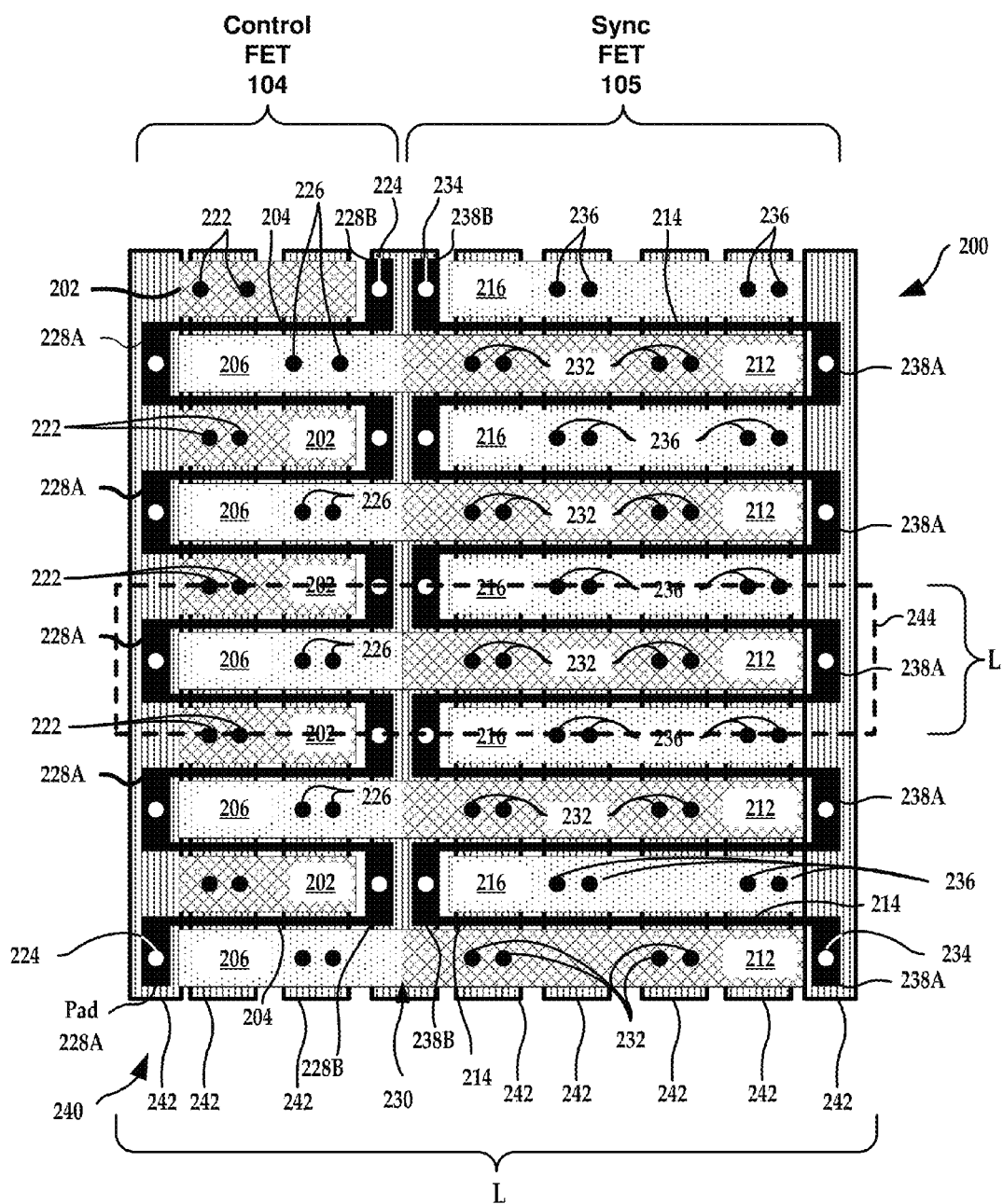
FIG. 2 illustrates a zero level (ohmic) metal layer of a dual FET device for fabricating the circuit of FIG. 1B on a single chip.

FIG. 2 illustrates a zero level metal layer 200 of a dual FET device for fabricating the circuit 110 of FIG. 1B on a single chip. A first level metal layer 240 includes contacts 242. The zero metal layer 200 includes regions in the metal layer for the control FET 104 and sync FET 105.

The control FET 104 of the zero metal layer 200 includes source fingers 206 alternating with drain fingers 202. A serpentine gate finger 204 included in the zero metal layer 200, is disposed in a gate channel between each adjacent source finger 206 and drain finger 202.

Similarly, the sync FET 105 of the zero metal layer 200 includes source fingers 216 alternating with drain fingers 212. A serpentine gate finger 214 is disposed in a gate channel between each adjacent source finger 216 and drain finger 212 of the sync FET 105. The ohmic metals provide low resistance contact to the compound semiconductor material of the zero metal layer 200. The structure of the source fingers 206 and 216, and the drain fingers 202 and 212 includes ohmic metal. The source fingers and drain fingers may be fabricated using an alloyed metal structure forming ohmic metal deposited on a respective source finger 206 and 216 region and drain finger 202 and 212 region of doped semiconductor. The wafer may be heated so that the metals alloy (or diffuse) into the epitaxial layer creating the low resistance connections.

The gate fingers 204 and 214 may be formed as a Schottky contact. The gate channel may provide spacing for the gate fingers 204 and 214 between the respective source fingers and the drain fingers. While the gate fingers 204 and 214 may not employ ohmic metals they are included as part of the zero metal layer 200. The serpentine pattern of the gates 204 includes dual gate pads 228A and 228B. Likewise, the serpentine pattern of the gates 214 includes dual gate pads 238A and 238B.

A first level of vias includes drain vias 222 disposed on the drain fingers 202, source vias 226, which are disposed on source fingers 206, gate vias 224, which are disposed on the dual gate pads 228A and 228B of the control FET 104, drain vias 232 disposed on the drain fingers 212, source vias 236 disposed on the source fingers 216, and gate vias 234 disposed on the dual gate pads 238A and 238B of the sync FET 105. The first level vias of FIG. 2 may be disposed as a separate layer between the zero metal layer 200 and the first metal layer 240.

The first level metal layer 240 and first level vias are above the zero metal layer 200. However, the first metal layer 240, which is above the zero metal layer 200, is illustrated as being transparent to reveal the details of the zero metal layer 200 that is below the first metal layer 240. The first level vias of FIG. 2 are disposed between the zero metal layer 200 and the first metal layer 240 to provide connections between elements of the first level metal layer 240 and the zero level metal layer 200.

As can be seen in FIG. 2, the connection between the control device's source fingers 206 and the sync device's drain fingers 212 may be distributed laterally across a width of the entire chip. This distribution provides for a uniform connection at the switching node 230 and at the same time provides for low parasitics. An exemplary unit cell 244 is indicated using a dotted rectangle. The unit cell 244 may be repeated many times across the zero metal layer 200. Looking carefully at FIG. 2, one can see that the structure effectively comprises a parallel connection of a large number of individual dual device unit cells 244 connected (using a subsequent metal layer) in parallel. These unit cells 244 may be on the order of about 5-15 microns up to a few tens of microns in length L, and about 100 microns up to a few millimeters in width W.

The present technology provides improvements over the dual gFET™ device. The improvements may decrease the dimensions of the unit cell 244 to distribute more instances of the unit cell 244 in both the horizontal and vertical directions to form the overall structure from a two dimensional array of unit cells 244.

Figure 3:
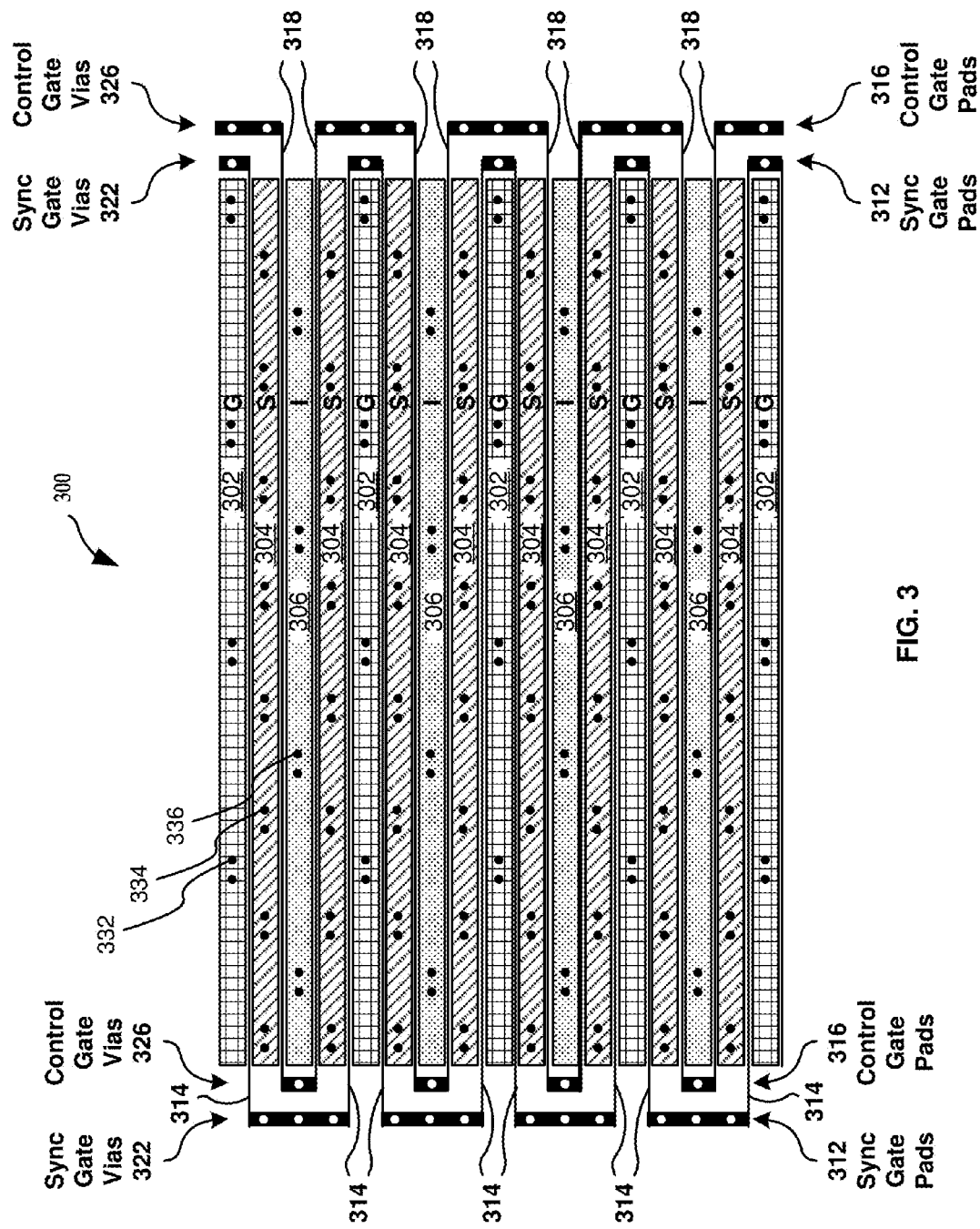
FIG. 3 illustrates an alternative embodiment of a zero metal layer and a first level vias for overlay onto the first level metal layer for an integrated dual switch device, in accordance with aspects of the technology.

FIG. 3 illustrates an alternative embodiment of a zero metal layer 300 and first level vias for connecting the zero metal layer to a first level metal layer for an integrated dual switch device 112, in accordance with aspects of the technology. FIG. 3 differs from FIG. 2 in that the ohmic metal fingers of zero metal layer 300 are arranged in an alternative geometry from the ohmic metal fingers of zero metal layer 200. It is noteworthy that fingers of the zero metal layer 300 represent the three different nodes of the dual device, namely Input node 306 (input finger 306), Switching node 304 (switching finger 304), and Ground node 302 (ground finger 302). These three nodes or fingers may be interleaved in a pattern. The interleaved nodes are labeled in FIG. 3 as a repeating pattern of: I-S-G-S-I-S-G-S . . . Where:
I=Input node (or input finger) 306
S=Switching node (or input finger) 304
G=Ground node (or input finger) 302

The zero metal layer 300 further includes two sets of serpentine gates used for switching the nodes of this device 112. The first of the two serpentine gates includes Sync gates 314, Sync gate pads 312 and Sync gate vias 322, the second of the two serpentine gates includes Control gates 318, Control gate pads 316, and Control gate vias 326. The two sets of serpentine gates are now interleaved with each other as opposed to separated as shown in the zero metal layer 200 of the dual device structure 112 illustrated in FIG. 2 as serpentine control gates including control gate pads 228A and 228B, control gates 204, and control gate vias 224 and as serpentine sync gates including sync gate pads 238A and 238B, sync gates 214, and sync gate vias 234.

Figure 4A:
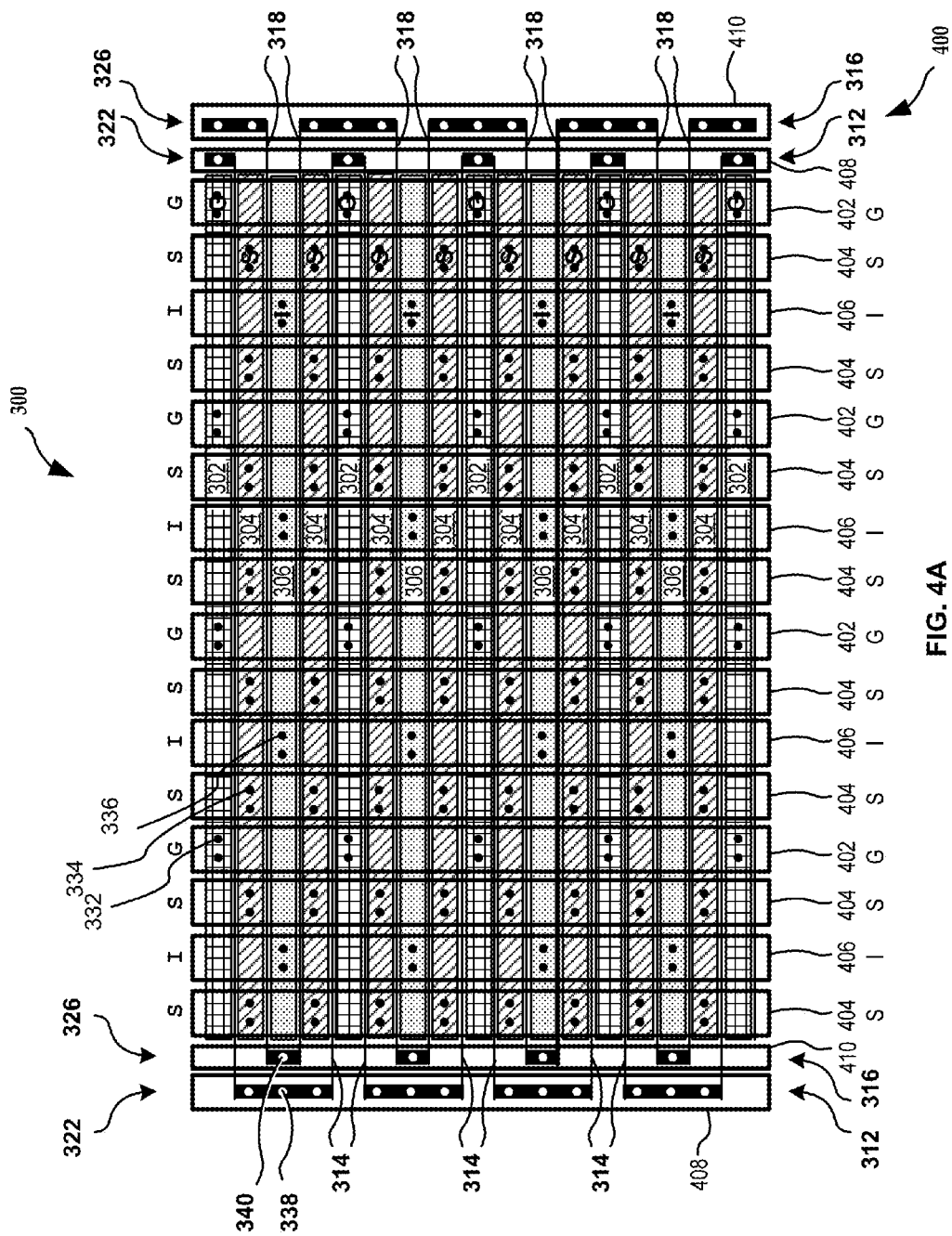
FIGS. 4A and 4B illustrate an overlay of a first metal level and the zero metal layer of the integrated dual switch device, in accordance with aspects of the technology.
Figure 4B:
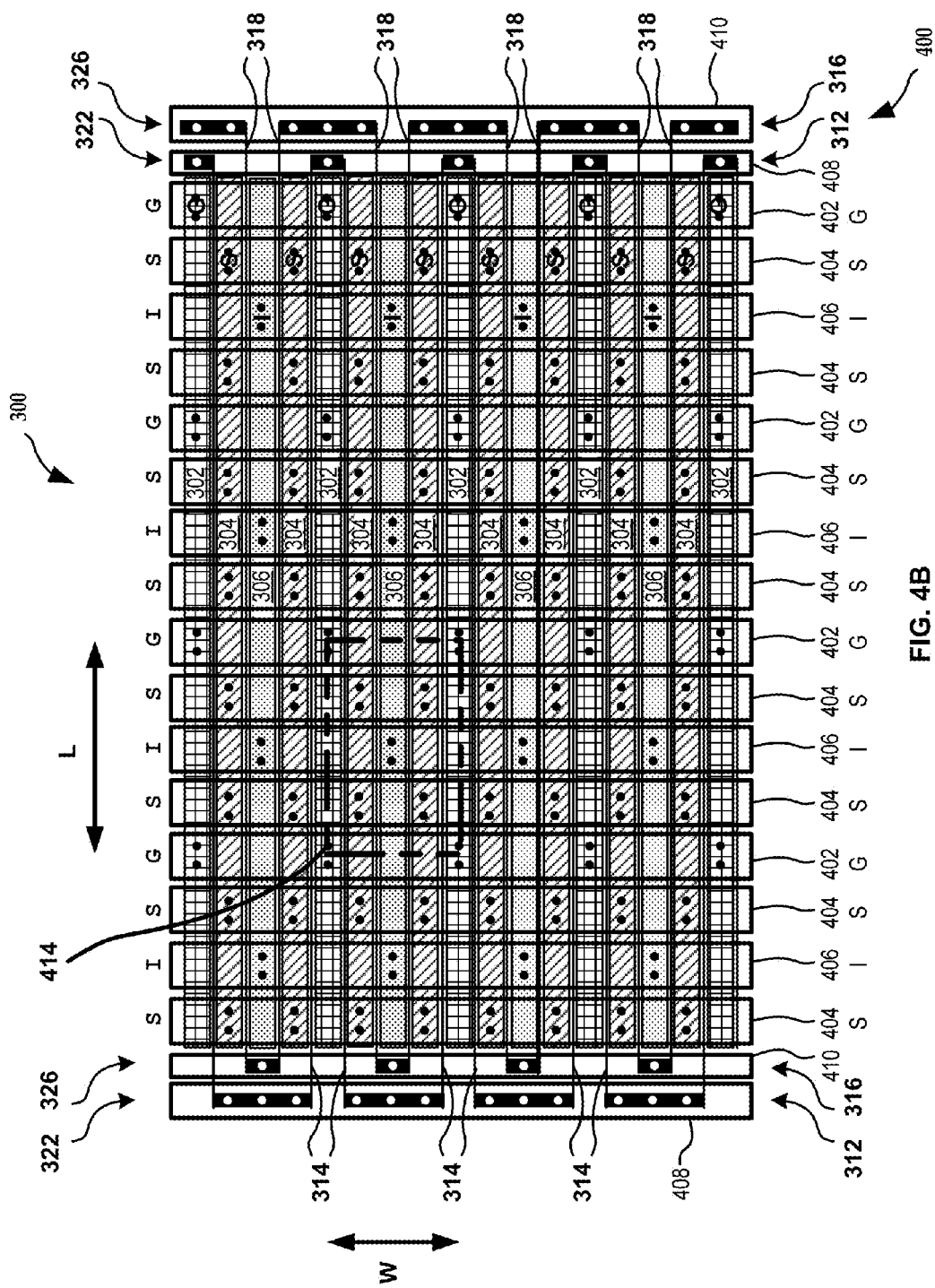

FIGS. 4A and 4B illustrate an overlay of a first metal level (or metallic layer) 400 and the zero metal layer 300 of the integrated dual switch device 112, in accordance with aspects of the invention. FIG. 4B differs from FIG. 4A in that a unit cell 414 is indicated using a dotted line box. The first metal level 400 includes metal electrodes 402-410. As illustrated in FIG. 4A and 4B, metal electrodes 402 may be parallel. Metal electrodes 402-406 communicate current to the I, S, and G nodes. Metal electrodes 408 and 410 communicate current to the sync gate pads 312 and control gate pads 316.

Figure 5A:
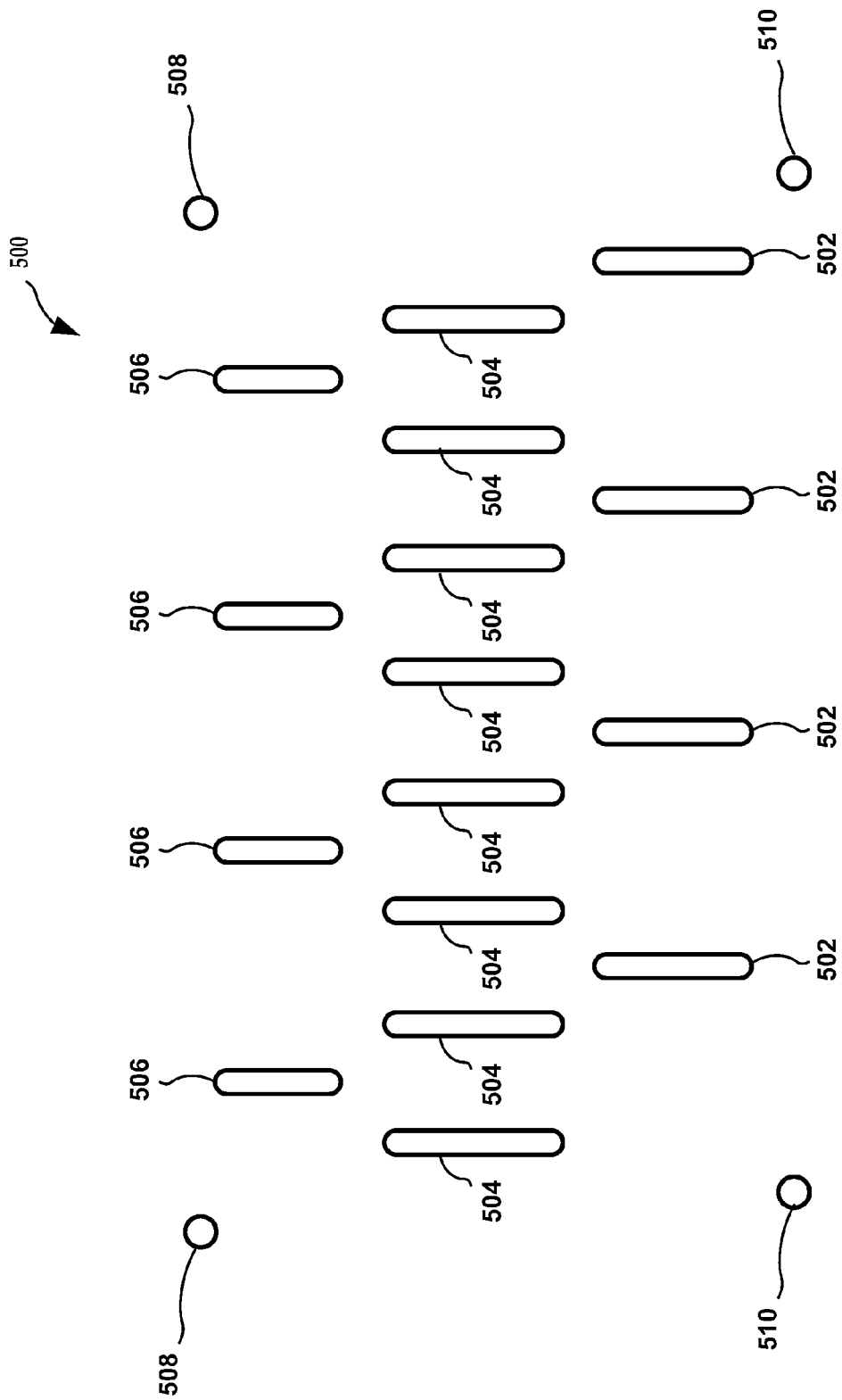
FIG. 5A illustrates a second level via layer of the integrated dual switch fabric illustrated FIGS. 3, 4A, and 4B, in accordance with aspects of the technology.
Figure 5B:
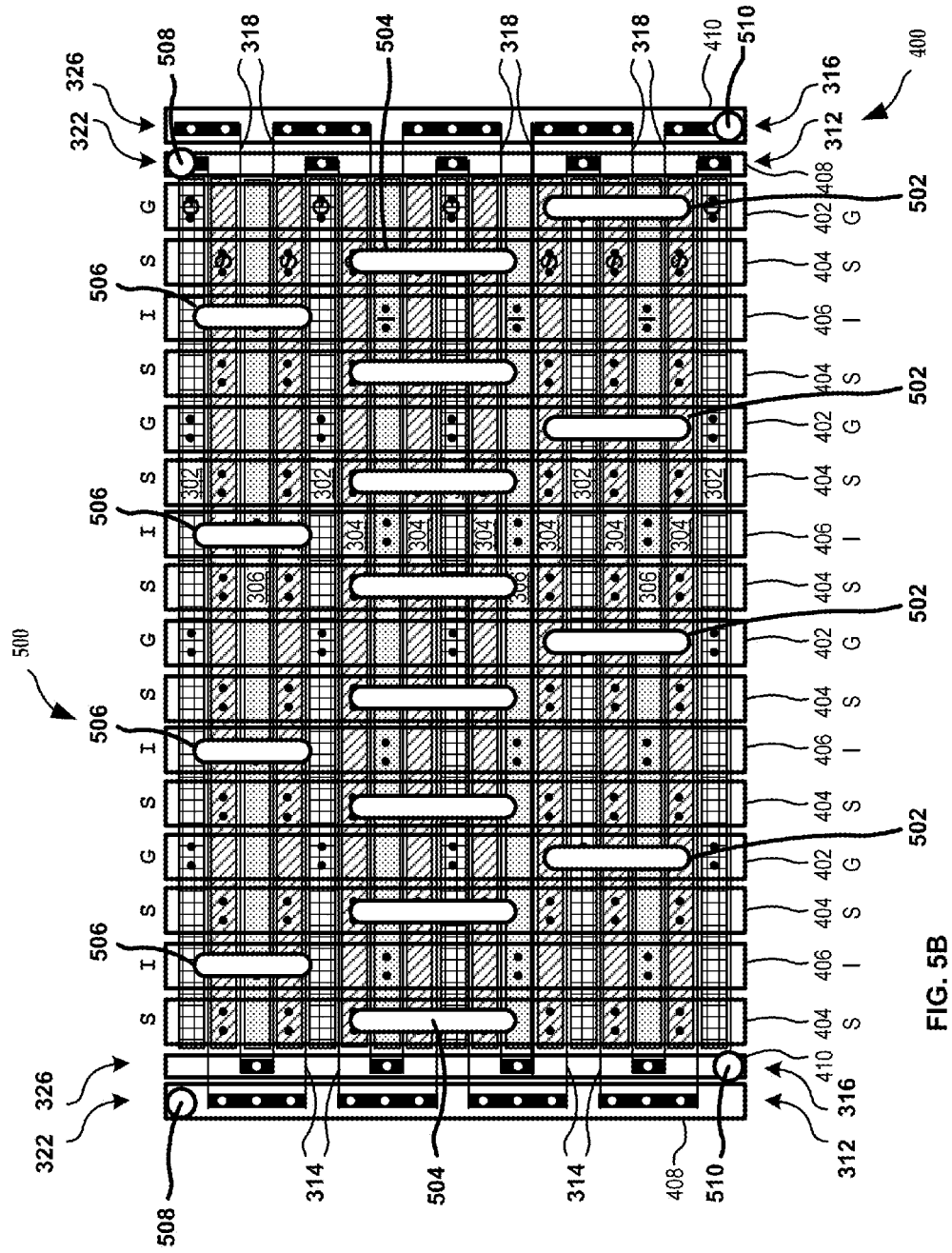
FIG. 5B illustrates an overlay of the second level via layer on the integrated dual switch fabric illustrated FIGS. 3, 4A, and 4B.
Figure 6:
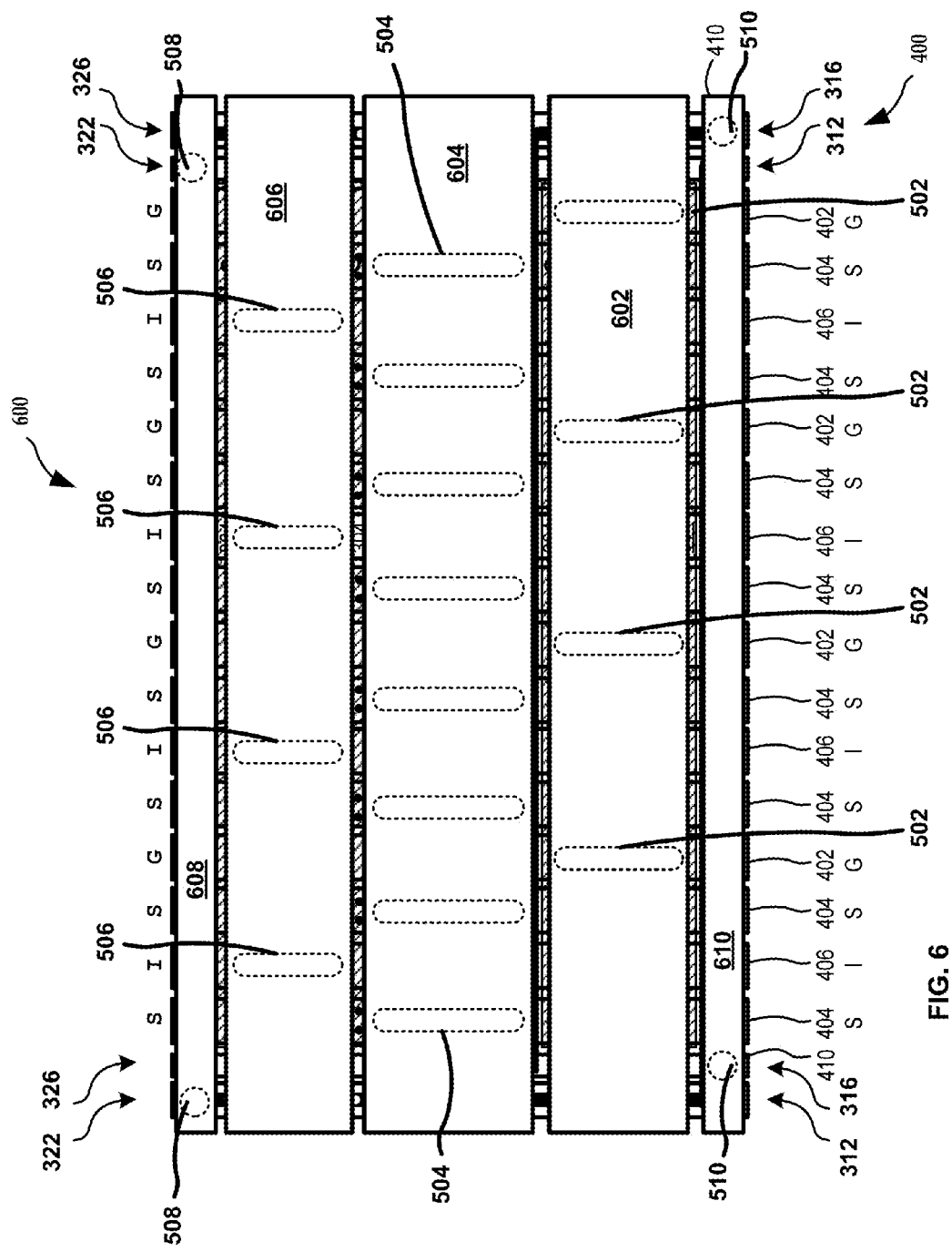
FIG. 6 illustrates the second level metal layer of the integrated dual switch fabric, in accordance with aspects of the technology.

Each of the metal electrodes in FIGS. 4-6 is labeled either I, S, or G. The metal electrodes 404 are labeled "S" indicating that the metal electrodes 404 conduct current to the switching nodes 304 through vias 334 disposed between the metal electrodes 404 and the switching nodes 304. The metal electrodes 406 are labeled "I" indicating that the metal electrodes 406 conduct current to the input nodes 306 through vias 336 disposed between the metal electrodes 406 and the input nodes 306. The metal electrodes 402 are labeled "G" indicating that the metal electrodes 402 conduct current to the ground nodes 302 through vias 332 disposed between the metal electrodes 402 and the ground nodes 302. The metal electrodes 408 conduct current to the sync gate pads 312 through control gate vias 338. The metal electrodes 410 conduct current to the control gate pads 316 through control gate vias 340.

It is noteworthy that in contrast to the unit cell 244 in the layout of the zero metal layer 200 illustrated in FIG. 2, a unit cell 414 illustrated in FIG. 4B is on the order of length L of about 10-30 microns by width W of about 30-50 microns, or approximately several thousand times smaller in area than unit cell 244. However, this unit cell may be repeated many times in both the dimensions (X axis and Y axis) to make up the total structure illustrated in FIG. 4B. Thus, there may be about 50× more individual dual switch unit cells 414 in the completed gFET™ switch fabric of the first metal layer 400. Thus, this device has an even more uniform connection at the switching node 304, which may result in substantially lower parasitics than the previous design represented in FIG. 2.

FIG. 5A illustrates a second level via layer 500 of the integrated dual switch fabric illustrated FIGS. 3, 4A, and 4B, in accordance with aspects of the technology. FIG. 5B illustrates an overlay of the second level via layer 500 on the integrated dual switch fabric illustrated FIGS. 3, 4A, and 4B. The second level via layer 500 includes ground vias 502, switching vias 504, input vias 506, sync switch gate vias 508, and control switch gate vias 510.

FIG. 6 illustrates the second level metal layer 600 (or second metal layer 600) of the integrated dual switch fabric, in accordance with aspects of the technology. The second level metal layer 600 includes a ground electrode 602, a switching electrode 604, an input electrode 606, a sync switch gate electrode 608 and a control switch gate electrode 610. It is noteworthy that the layout of FIG. 6 results in all five electrical contact points (input, switching node, ground, control switch gate input and sync switch gate input) to be optimally located on the top surface of the die for simplified connection to the next level assembly. The ground vias 502, switching vias 504, input vias 506, sync switch gate vias 508, and control switch gate vias 510 are illustrated using dotted lines indicating that they are disposed below the ground electrode 602, a switching electrode 604, an input electrode 606, a sync switch gate electrode 608 and a control switch gate electrode 610, respectively, that are between the first metal layer 400 and the second level metal layer 600.

The ground vias 502 of the second level via layer 500 are configured for conducting current between ground nodes 402 and ground electrodes 602 of the second level metal layer 600. The switching vias 504 of the second level via layer 500 are configured for conducting current between switching nodes 404 and switching electrodes 604 of the second level metal layer 600. The switching vias 504 of the second level via layer 500 are configured for conducting current between switching nodes 404 and switching electrodes 604 of the second level metal layer 600. The input vias 506 of the second level via layer 500 are configured for conducting current between input nodes 406 and input electrodes 606 of the second level metal layer 600. The sync switch gate vias 508 of the second level via layer 500 are configured for conducting current between sync gate pads 312 and sync switch gate electrodes 608 of the second level metal layer 600. The control switch gate vias 510 of the second level via layer 500 are configured for conducting current between control switch gate metal electrodes 410 and control switch gate electrodes 610 of the second level metal layer 600.

It is noteworthy that the device layout illustrated in FIGS. 3-6 may be configured such that all five electrical contact points (including input electrode 606, switching electrode 604, ground electrode 602, control switch gate electrode 610, and sync switch gate electrode 608) may be optimally located on the top surface of the die for simplified connection to the next level assembly.

In the example shown above, the gate peripheries of the control and sync devices may be about equal because for every sync device metal finger in the zero metal layer (representing two channels worth of gate width) there may be a corresponding control device metal finger in the zero metal layer. Thus, the control and sync switch on-resistance values may also be equal. In some embodiments, it is desirable that the devices have on-resistance ratios different from 1:1.

Figure 7:
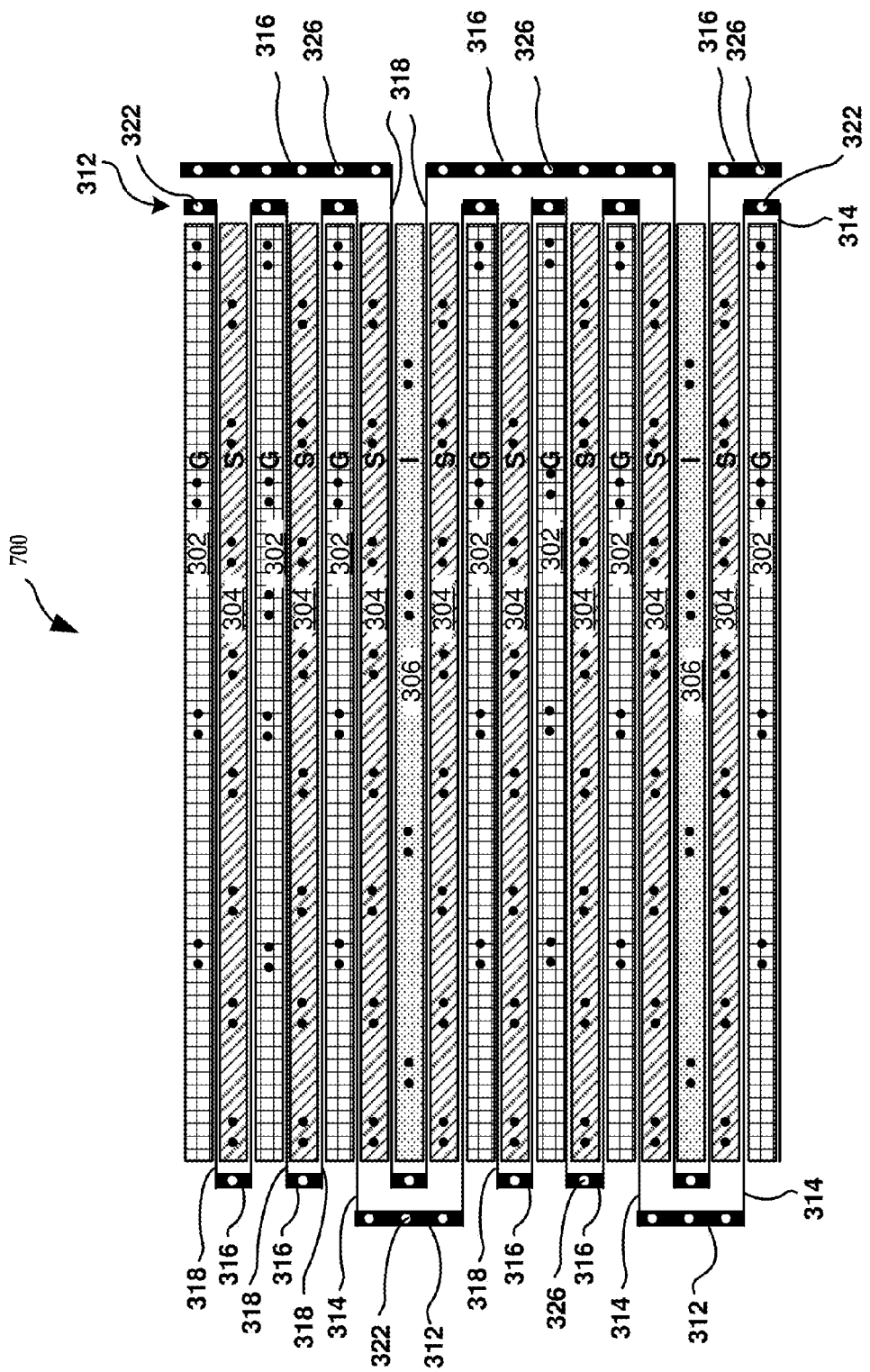
FIG. 7 illustrates an alternative embodiment of a zero metal layer for an integrated dual switch fabric, in accordance with aspects of the technology.

FIG. 7 illustrates an alternative embodiment of a zero metal layer 700 for an integrated dual switch fabric, in accordance with aspects of the technology. This embodiment provides a switch fabric supporting a resistance ratio of about 3:1. In the zero metal layer 700 of FIG. 7, every fourth non-switching node ohmic metal finger is an input node 306 for receiving the input voltage, so in this case the control FET gate periphery is one-third that of the sync FET gate periphery, so its on-resistance is three times higher. The unit cell for the metal layer 700 may be larger than for the equal gate periphery case shown elsewhere herein, e.g., FIGS. 3-6, as the unit cell for the metal layer 700 may encompass eight gate channels instead of four. However, the unit cell is still substantially smaller than for the zero metal layer 200 illustrated in FIG. 2, and may be still repeated in both dimensions to create the overall structure.

In some embodiments, an E-mode switch may be used to protect other FET switches. Referring again to FIG. 1A, when an input voltage ($V_{in}$) is initially applied to this circuit a driver 109 in the converter may take some finite delay time to power up before it can actively control the gates of the two switch devices 104 and 105. Because MOSFET devices are non-conductive in the absence of a control signal (normally off), during this turn-on time when there is no voltage applied to the gates of the switches, the switches remain off and will not conduct current from the input to the output ($V_{out}$). If this were not the case the resulting uncontrolled current conduction could cause damage to circuits connected to $V_{out}$ and/or would waste energy by allowing current to flow through both devices directly to ground. However, the normally-off nature of the MOSFET switches prevents this from happening and guarantees that the system's control electronics will be powered up and actively controlling the switches before any current can pass through the converter.

The gFET™ switch can be fabricated as either a normally-off (also known as an enhancement-mode, or E-mode) device or a normally-on (depletion-mode, or D-mode) device. At turn-on the E-mode gFET™ device functions similarly to the MOSFET device preventing unwanted current flow.

The D-mode gFET™ device, on the other hand, is normally-on when zero or no voltage is applied to its gate electrode. Thus, a converter circuit made with all D-mode devices may be inherently uncontrolled upon system turn-on and may conduct current in an uncontrolled and potentially wasteful and/or damaging fashion before the control electronics can apply proper voltages to the devices' gate electrodes.

However, the D-mode gFET™ device has advantages over its E-mode counterpart. Chief among these is that it can be fabricated in a smaller overall footprint than an E-mode version for a given minimum on-resistance. This implies that the D-mode device would be cheaper to manufacture than its E-mode equivalent.

In order to achieve the control benefits of the normally-off devices and the smaller size/cost of the normally-on devices, a previous invention proposed a dual-mode, dual-switch gFET™ device, wherein the control FET is an E-mode device and the sync FET is a D-mode device. (See, e.g., U.S. patent application Ser. No. 13/442,313, filed Apr. 9, 2012, titled "Mixed Mode Dual Switch" (now U.S. Pat. No. 8,637,909 issued on Jan. 28, 2014), and U.S. patent application Ser. No. 13/364,258, filed Feb. 1, 2012, titled "Self Clamping FET Devices in Circuits Using Transient Sources" (now U.S. Pat. No. 8,569,811 issued on Oct. 29, 2013), both applications being incorporated herein in their entirety.) Because the E-mode control FET is normally off it may block the flow of any current into the converter circuit during the start-up phase, thus, it may avoid wasted energy or potential start-up damage. At the same time, by making the sync FET a D-mode device, it has the benefits of smaller size (for a given on-resistance).

FIG. 1B illustrates an example of a control/sync FET converter circuit pair that can be realized on a single chip. In some embodiments, the circuit of FIG. 1B may be fabricated using previously described gFET™ technology to integrate multiple control/sync device pairs into the same chip creating converter circuits that can support two or more phases.

Figure 8:
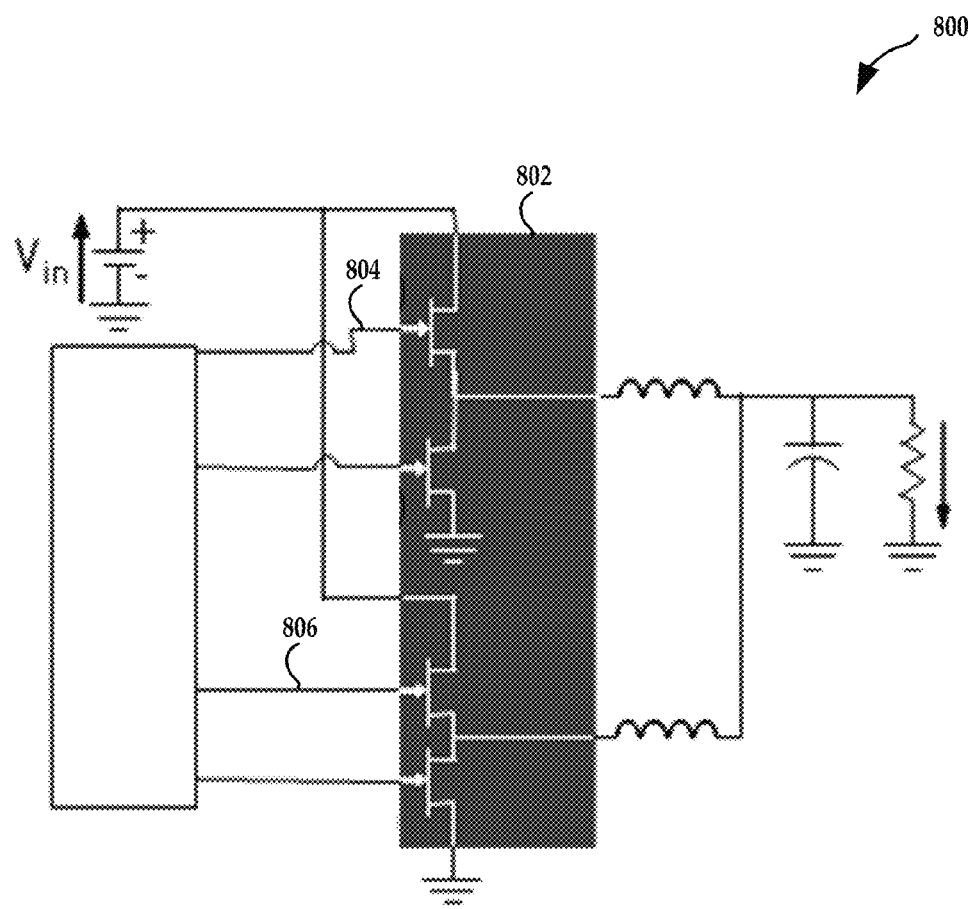
FIG. 8 illustrates an example of circuit including two control/sync FET converter circuit pairs that can be realized on a single chip.

FIG. 8 illustrates an example of circuit 800 including two control/sync FET converter circuit pairs that can be realized on a single chip. In some embodiments, the circuit 800 of FIG. 8 may be fabricated using previously described gFET™ technology to integrate multiple control/sync device pairs into the same chip 802 creating converter circuits that can support two or more phases. In some embodiments, both phases may be simultaneously protected from conducting current uncontrollably during turn-on if both of the upper devices in the two phases (the phases controlled by the gate electrodes 804 and 806) use E-mode type devices.

Figure 9A:
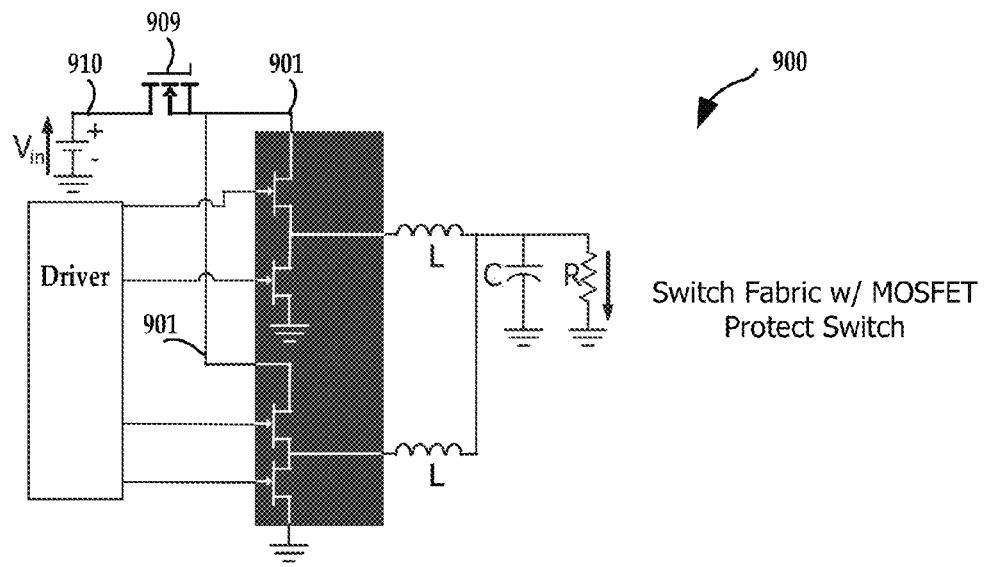
FIG. 9A illustrates a circuit for protecting both phases of the converter circuit of FIG. 8.

FIG. 9A illustrates a circuit 900 for protecting both phases of the converter circuit of FIG. 8. The circuit of FIG. 9A differs from FIG. 8 in that the Dual Phase Device circuit illustrated in FIG. 9A includes an external MOSFET Protection Switch 909. In this approach a solution for protecting both phases of the converter circuit from conducting current during the turn-on phase would be to simply insert a conventional MOSFET switch in series between $V_{in}$ (910) and the input terminals 901 of both gFET™ devices as shown in FIG. 9A.

Figure 9B:
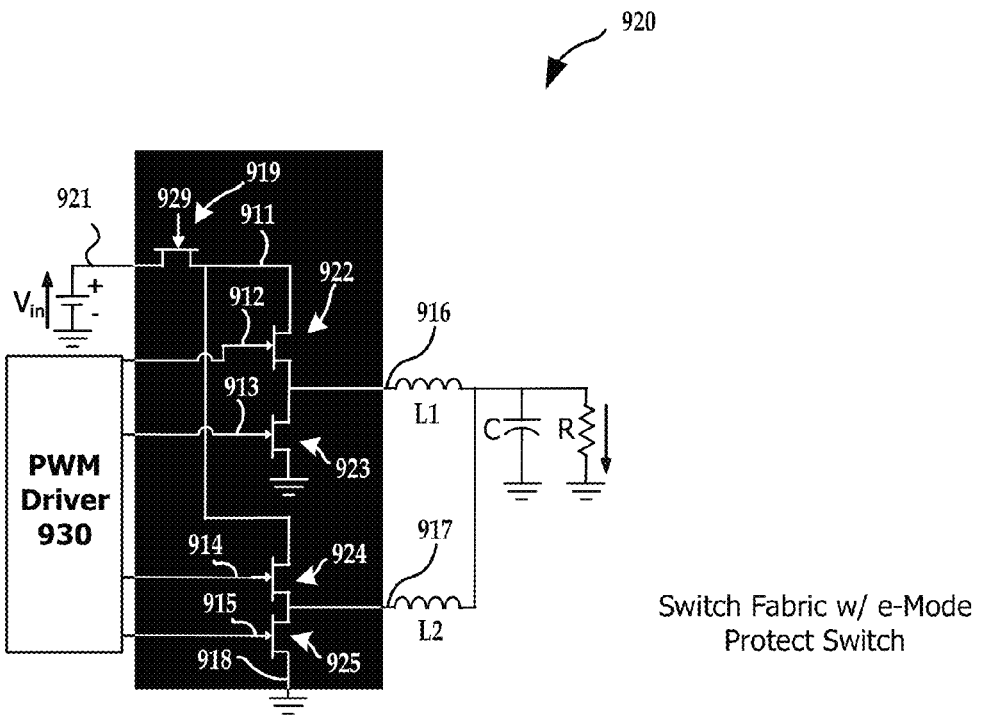
FIG. 9B illustrates an embodiment for using an internal e-Mode Protect Switch in accordance with aspects of the technology.

FIG. 9B illustrates an embodiment for using an internal e-Mode Protect Switch 919 in accordance with aspects of the technology. FIG. 9B differs from FIG. 9A in that the dual phase device circuit 920 of FIG. 9B may be protected using a Switch Fabric that includes the internal e-Mode Protect Switch 919 instead of an external MOSFET switch 909 as illustrated of FIG. 9A. A voltage in $V_{in}$ 921 may be applied on power up to the e-Mode Protect Switch 919, which is a normally off switch. The voltage $V_{in}$ 921 may be referenced to ground 918. The device circuit 920 includes a first FET pair comprising control switch 922 and sync switch 923. The device circuit 920 includes a second FET pair comprising control switch 924 and sync switch 925. A driver 930 controls application of gate signals to control gate 912, sync gate 913, control gate 914, and sync gate 915. An output 916 from the first FET pair may be applied to inductor L1. An output 917 from the second FET pair may be applied to inductor L2.

In the circuit design of FIG. 9B, the external MOSFET protection switch is replaced by a single E-mode gFET™ device 919 that is integrated with the input 911 of the control FETs 922 and 924 in both phases as shown in FIGS. 10-13. This E-mode switch 919, thus, serves to protect both phases simultaneously during turn-on.

Figure 10:
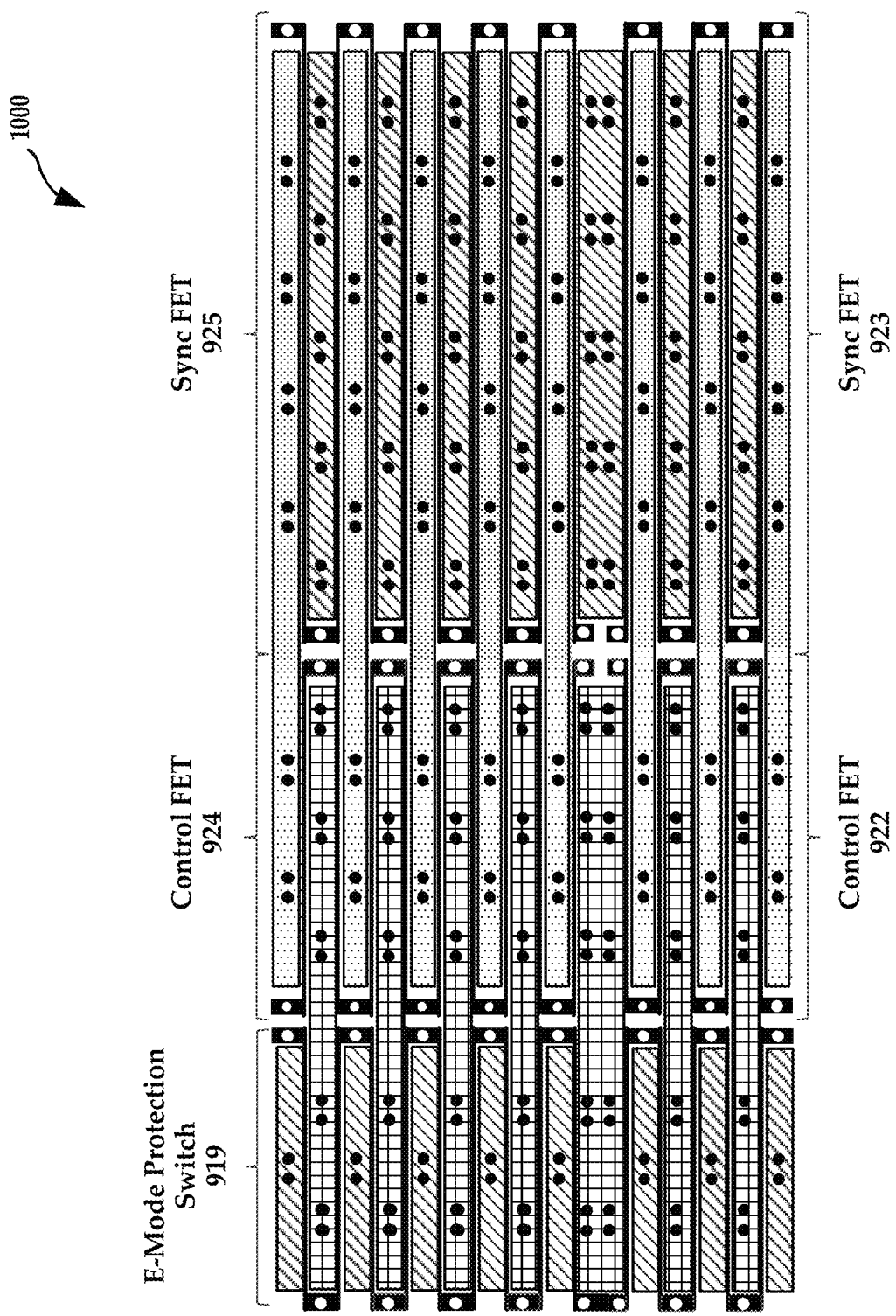
FIG. 10 illustrates a zero level metal layer and first level via layer of an integrated gFET™ device protection switch as shown in the circuit of FIG. 9B, in accordance with aspects of the technology.

FIG. 10 illustrates a zero level metal layer and first level via layer 1000 of an integrated gFET™ device protection switch as shown in the circuit of FIG. 9B, in accordance with aspects of the technology. The layer 1000 includes an E-mode switch 919 configured to provide protection for the control switches 922 and 924.

Figure 11A:
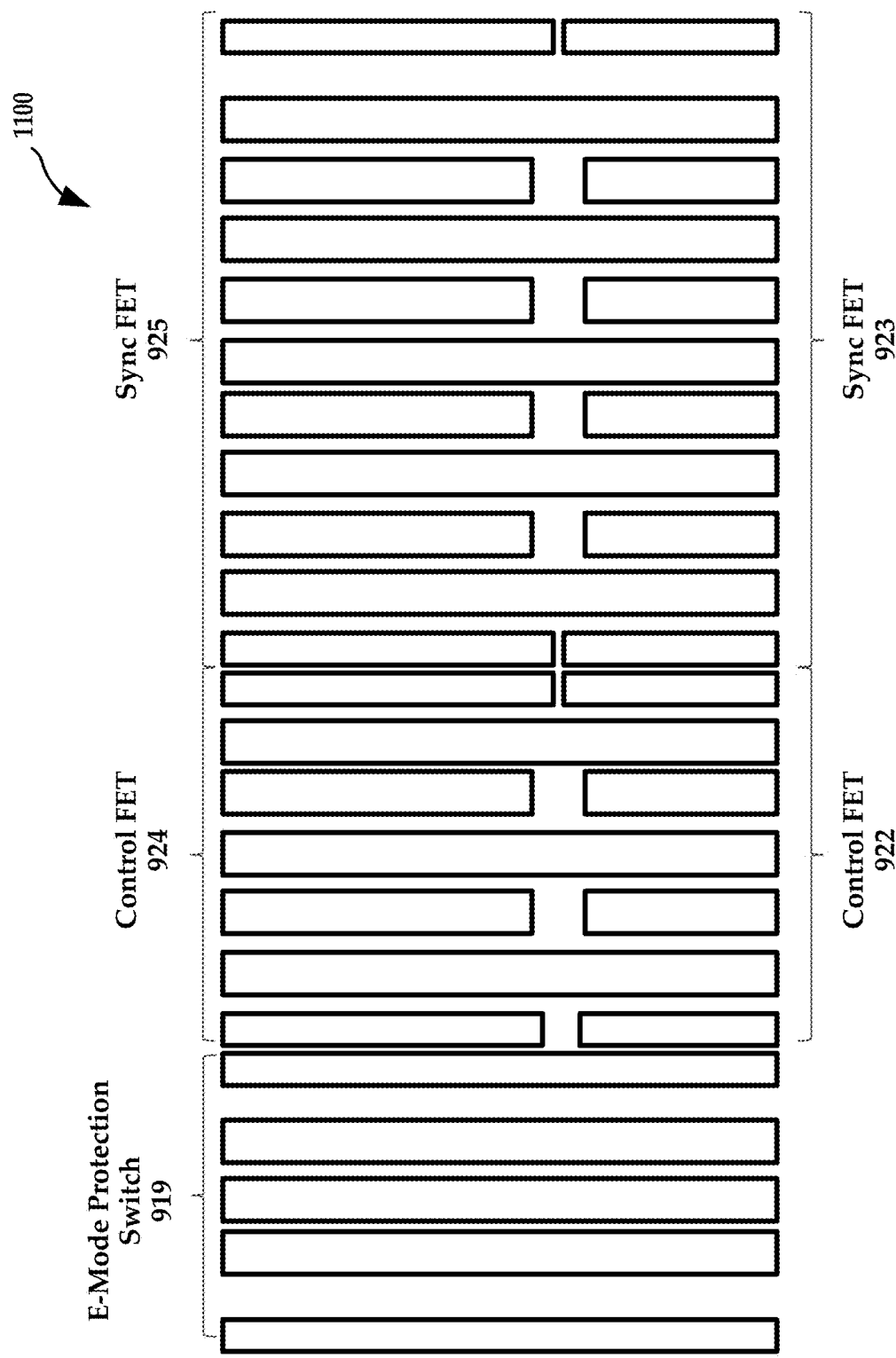
FIG. 11A illustrates a first level metal layer of an integrated gFET™ device protection switch.
Figure 11B:
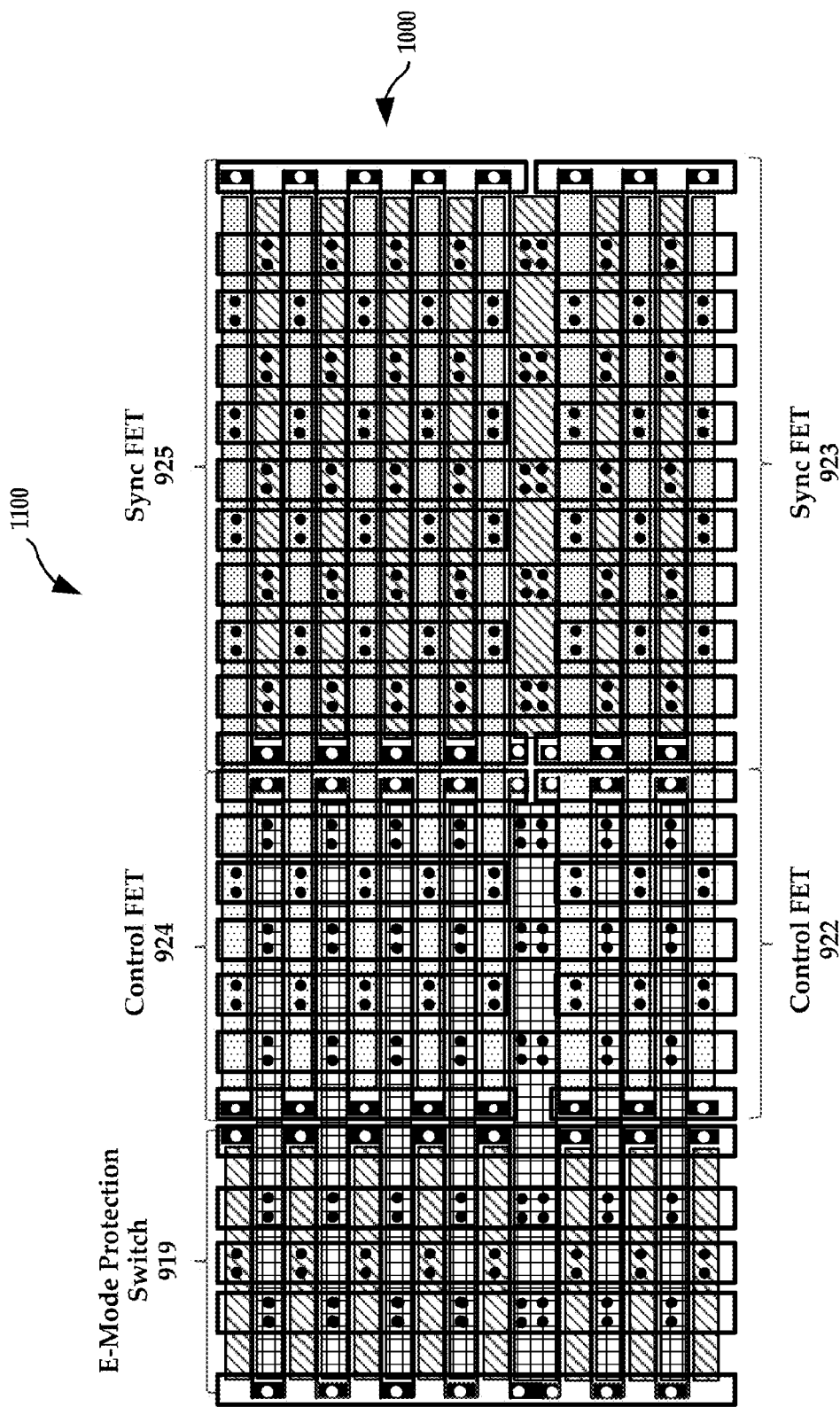
FIG. 11B illustrates the first level metal layer overlaid on the first level via layer of FIG. 10.

FIG. 11A illustrates a first level metal layer 1100 of an integrated gFET™ device protection switch. FIG. 11B illustrates the first level metal layer 1100 overlaid on the first level via layer 1000 of FIG. 10.

Figure 12A:
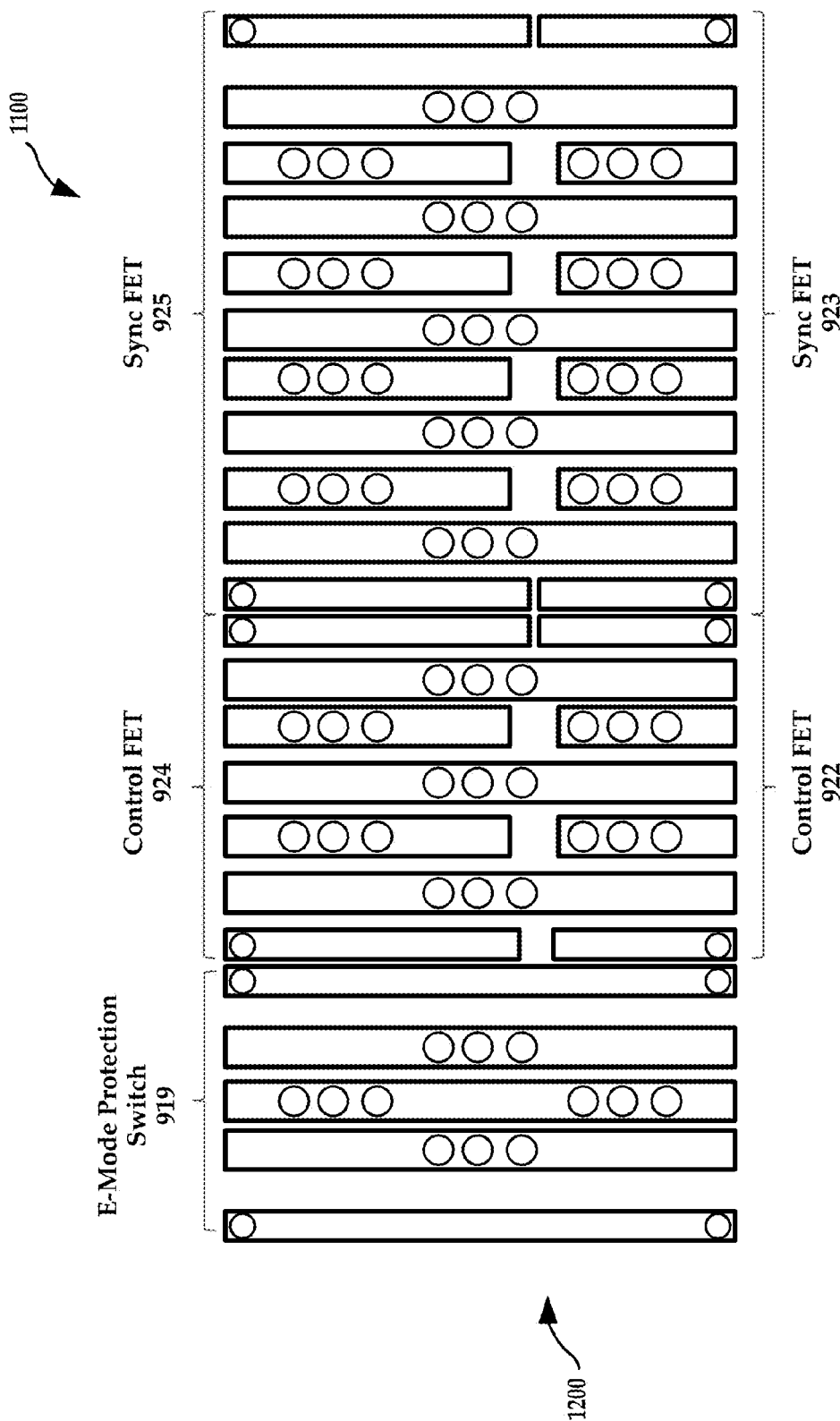
FIG. 12A illustrates a second level via layer of an integrated gFET™ device protection switch overlaid on the first level metal layer of FIG. 11.
Figure 12B:
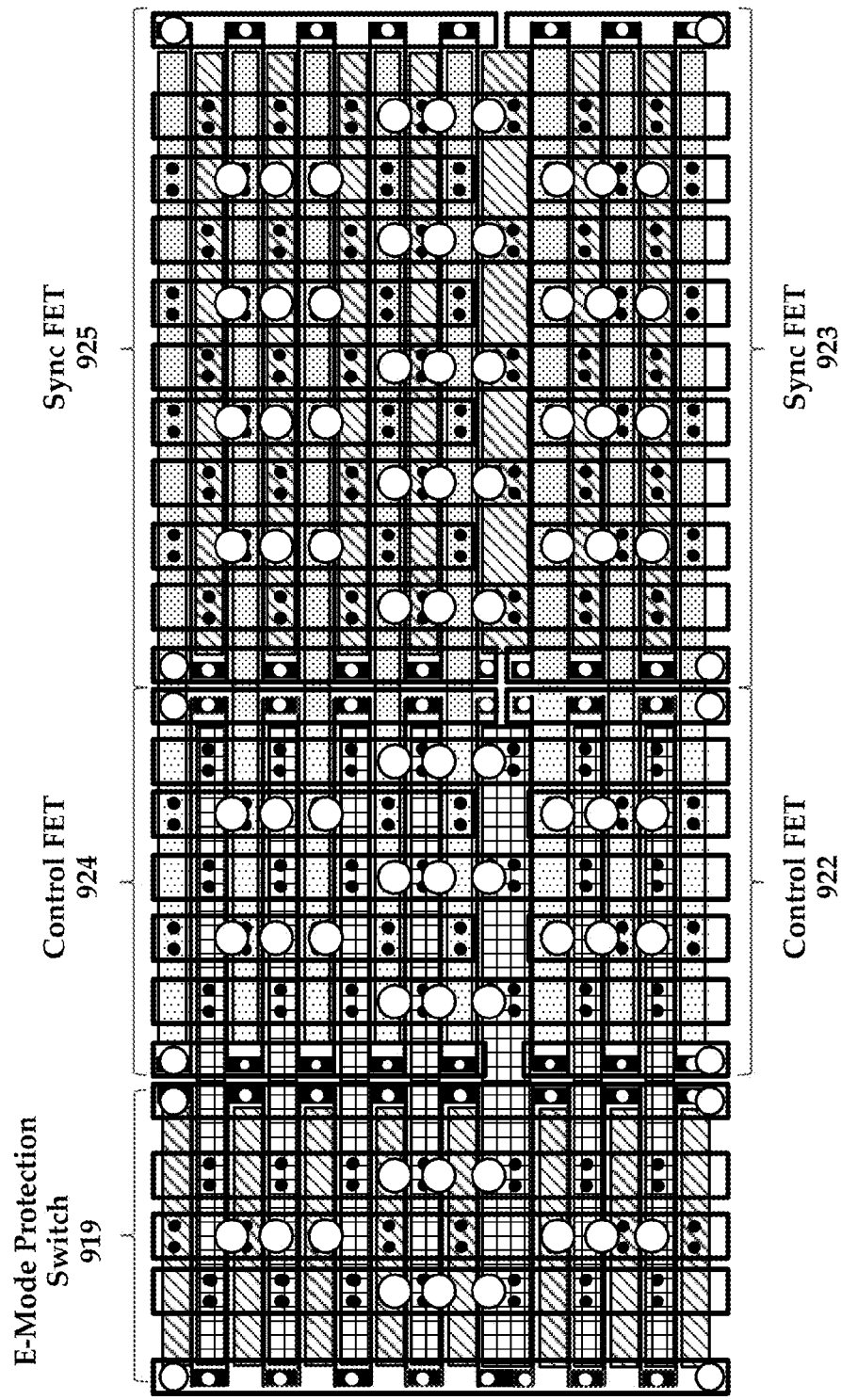
FIG. 12B illustrates the second level via layer and the first level metal layer overlaid on the layer of FIG. 10.

FIG. 12A illustrates a second level via layer 1200 of an integrated gFET™ device protection switch overlaid on the first level metal layer 1100 of FIG. 11. FIG. 12B illustrates the second level via layer 1200 and the first level metal layer 1100 overlaid on the layer 1000 of FIG. 10.

Figure 13:
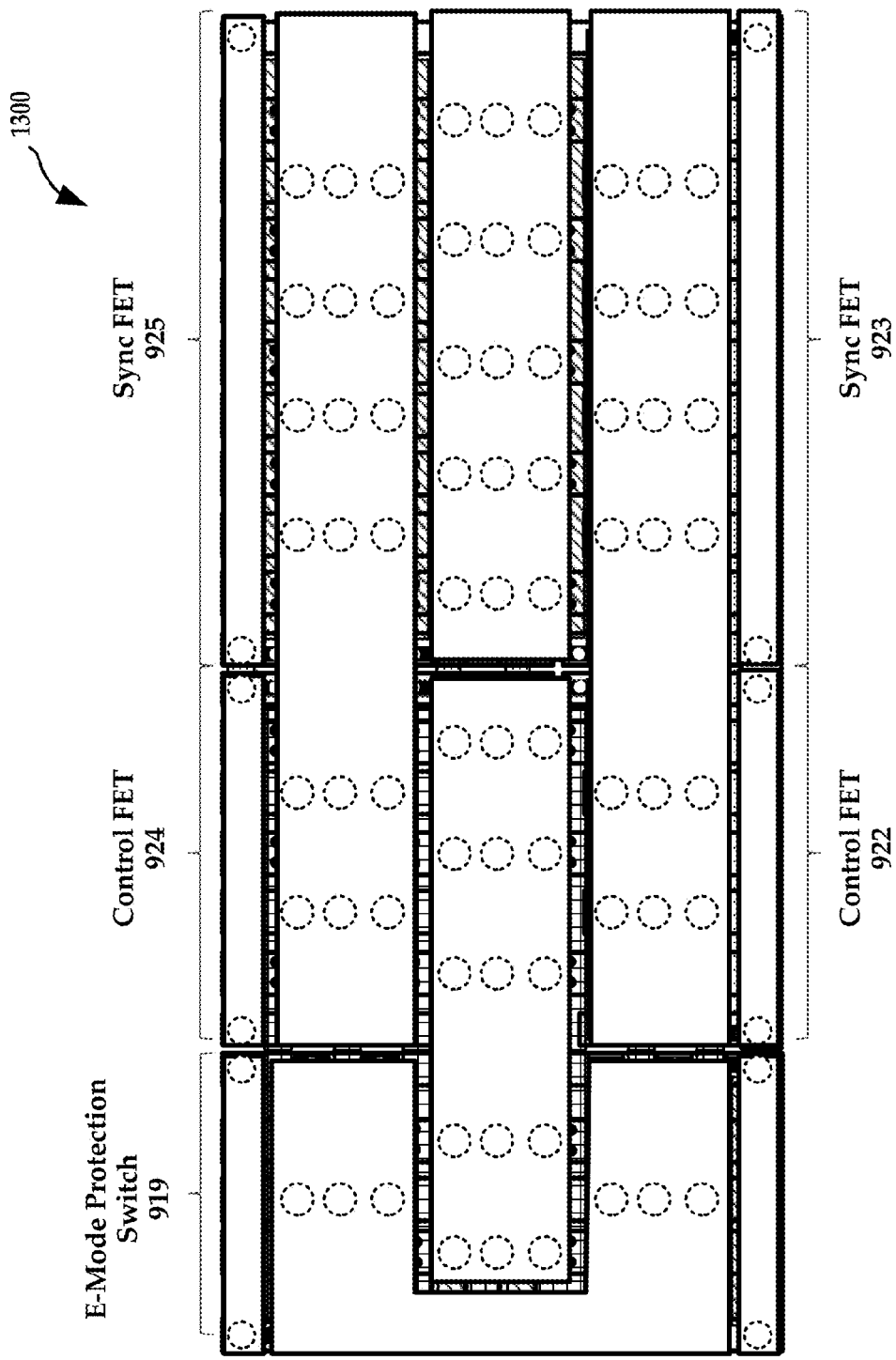
FIG. 13 illustrates a second level metal layer of an integrated gFET™ device protection switch overlaid on the second level via layer of FIG. 12B.

FIG. 13 illustrates a second level metal layer 1300 of an integrated gFET™ device protection switch overlaid on the second level via layer 1200 of FIG. 12B. The vias of the via layer level 1200 are illustrated using dotted lines indicating that vias are disposed below the second level metal layer 1300, that is between the first level metal layer 1100 and the second level metal layer 1300.

Figure 14:
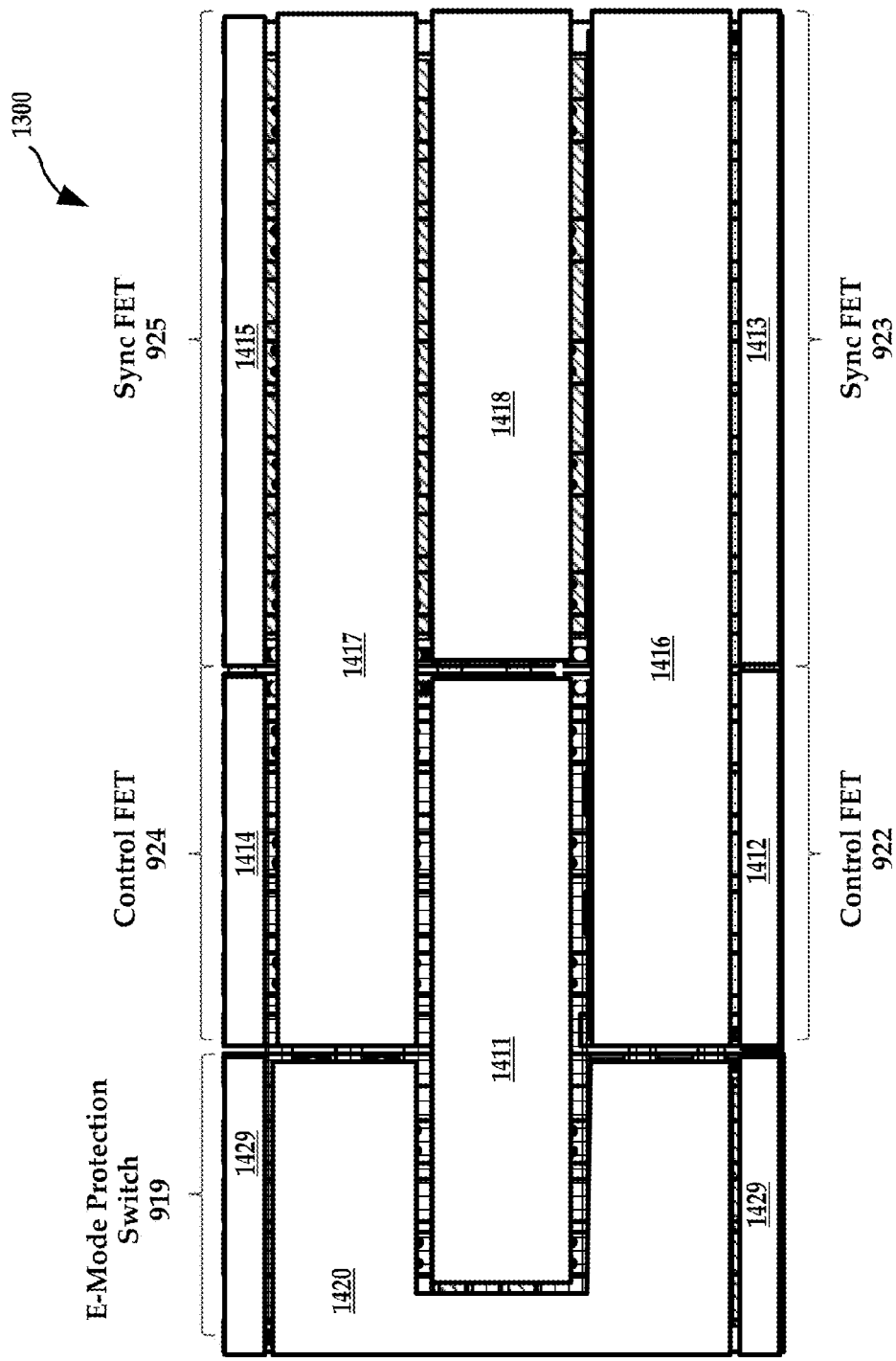
FIG. 14 illustrates the second level metal layer of FIG. 13 labeled to correspond to the circuit of FIG. 9B.

FIG. 14 illustrates the second level metal layer of FIG. 13 labeled to correspond to the circuit of FIG. 9B. The electrodes 1411-1429 of FIG. 14 correspond to the components of the circuit 9B. Electrode 1429 may receive a gate signal at 929 for e-Mode protection Switch 919. Electrode 1412 may receive a gate signal 912 for control FET 922. Electrode 1413 may receive a gate signal 913 for sync FET 923. Electrode 1414 may receive a gate signal 914 for control FET 924. Electrode 1415 may receive a gate signal 915 for sync FET 925. Electrode 1420 may receive $V_{in}$. Electrode 1418 may provide a ground reference for ground 918. Electrode 1411 may apply $V_{in}$ signal 911 to the first and second FET pairs. Electrode 1416 may communicate output from the first FET pair to a load, e.g., via inductor L1. Electrode 1417 may communicate output from the second FET pair to the load, e.g., via inductor L2.

It is noteworthy that all of the electrode nodes of the circuit of FIG. 14 may be arranged for access on a single surface of the single device of FIG. 14.

It is also noteworthy that the embodiments illustrated in FIGS. 9B-13 may provide for the integrated internal E-Mode Protect Switch to replace an external component (the MOSFET protect switch) with a fully integrated internal component. This may save board space and reduce parasitic circuit effects while also reducing assembly cost.

In addition, because of the lower resistivity of the D-mode devices compared to the E-mode ones, the die area saved by replacing the two E-mode control devices with their D-mode counterparts having the same on resistance can be used for the single E-mode protection switch without increasing the overall size (and cost) of the mixed-mode two-phase gFET™ switch fabric.

The technology described above may be extended to gFET™ switch fabrics with more than two phases further increasing the cost-effectiveness of the single E-mode protection switch when compared to the use of E-mode control devices to protect each phase individually. In a multi phase case that includes more than two phases, the area saved by using all D-mode control devices may exceed the area needed for an E-mode protection switch (e.g., E-Mode Protection Switch 919) by a sufficient amount to result in a net cost reduction of the switch fabric die. Alternatively, the surplus area may be used to create a larger (and, thus, lower resistance) protection switch resulting in a net improvement in the overall performance of the converter circuits.

In some embodiments, a current sensing switch may be integrated into various configurations a dual switch. Referring again to FIG. 1A, in dc-dc converter circuits, such as is shown in FIG. 1A, it is often advantageous to be able to monitor, in real time, the current flowing through the switch devices. Conventionally this is done with some kind of sensing circuit between the lower device and the ground terminal. If this sensing circuit is in series with the converter current flowing through the circuit, it may be extremely low loss in order to avoid degrading the conversion efficiency of the overall circuit. Typically some kind of highly accurate sensing resistor is used in order to give correct readings of the current flow.

A simple integrated solution for current sensing that can be used with the gFET™ switch fabric technology is described in detail elsewhere.

Figure 15A:
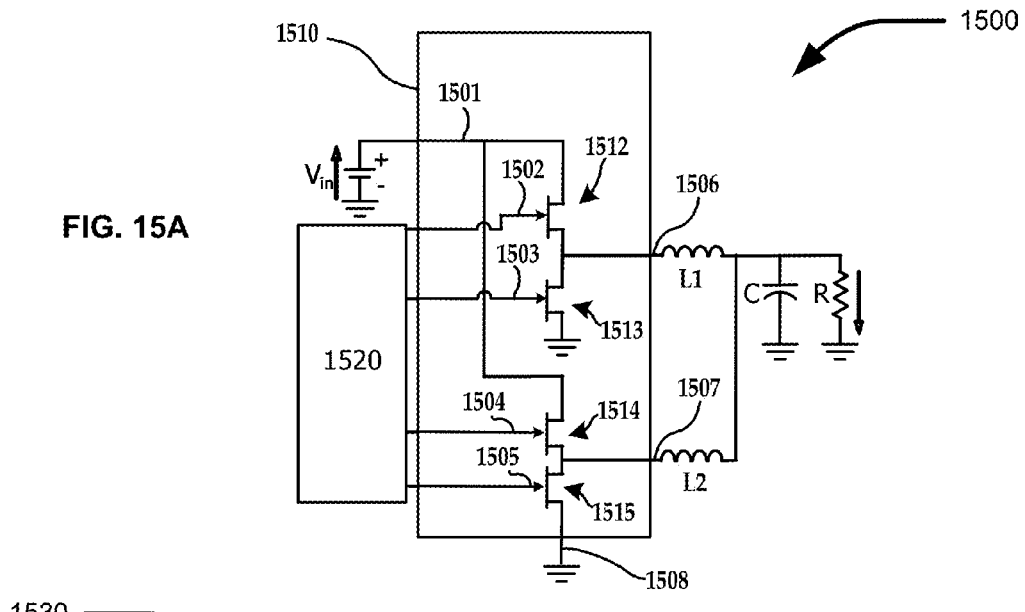
FIG. 15A illustrates an example of a Dual Phase Converter Circuit.
Figure 15B:
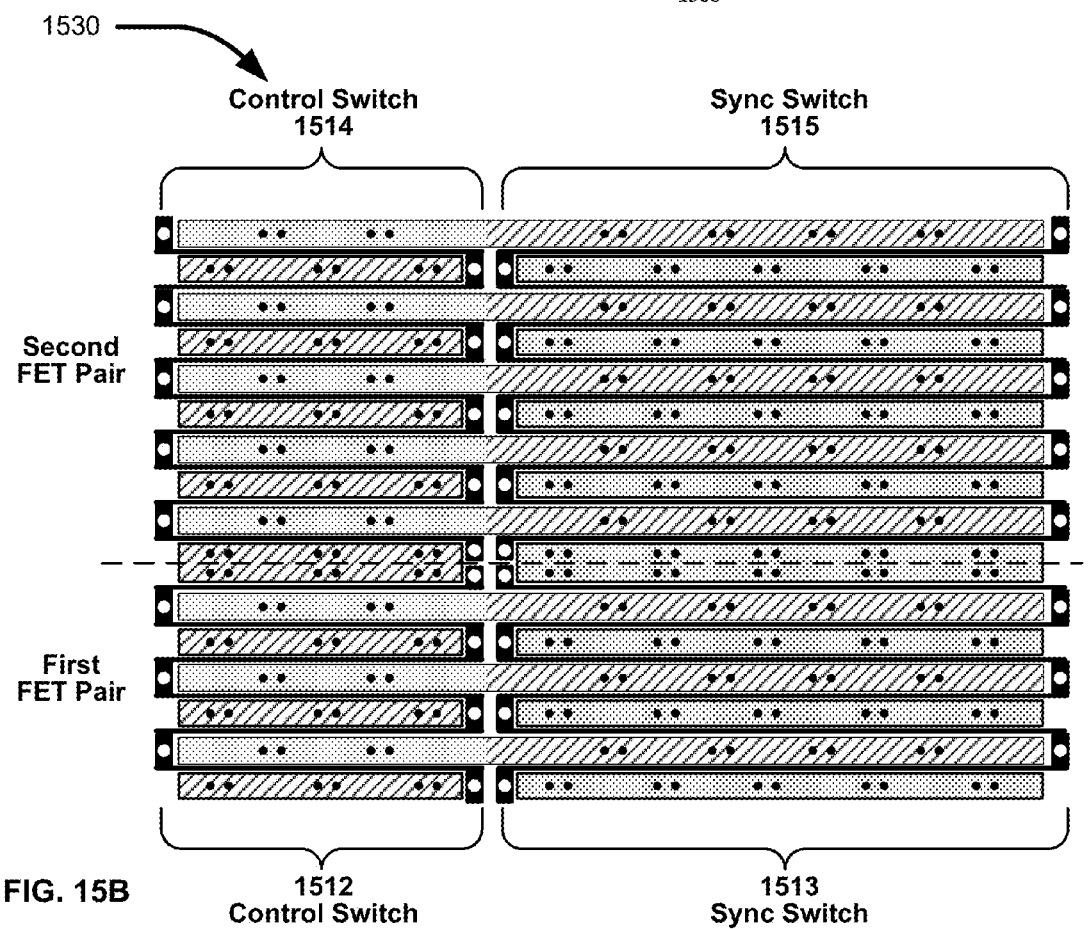
FIG. 15B illustrates an exemplary layout of a first level metal layer for a dual phase gFET™ switch fabric, which may be used in fabricating a dual phase device 1510 of the Dual Phase Converter Circuit.

FIG. 15A illustrates an example of a Dual Phase Converter Circuit 1500. FIG. 15B illustrates an exemplary layout of a first level via layer 1530 for a dual phase gFET™ switch fabric, which may be used in fabricating a dual phase device 1510 of the Dual Phase Converter Circuit 1500. The dual phase device 1510 includes a first FET pair comprising control switch 1512 and sync switch 1513. The dual phase device 1510 includes a second FET pair comprising control switch 1514 and sync switch 1515. A driver 1520 controls application of gate signals to control gate 1502, sync gate 1503, control gate 1504, and sync gate 1505. An output 1506 from the first FET pair may be applied to inductor L1. An output 1507 from the second FET pair may be applied to inductor L2. A voltage in $V_{in}$ 1501 may be applied to control switch 1502 and control switch 1504. The voltage $V_{in}$ may be referenced to ground 1508. The first level via layer 1530 of FIG. 15B includes a zero level metal layer comprising source fingers, drain fingers, gate fingers, and gate pads. The vias of the first level via layer are disposed on the source fingers, drain fingers, and gate pads.

FIG. 16 illustrates first level via layer 1600, which is alternative embodiment of the first level via layer 1530 for a dual phase gFET™ switch fabric of a dual phase gFET™ device 1510 of FIG. 15B, in accordance with aspects of the technology. FIG. 16 differs from FIG. 15B in that a small portion of one of the switch FETs of the first level via layer 1600 (within the dotted line box) is isolated from the rest of the device. Current sensing may be provided in this device by isolating a small portion of one of the switch FETs from the rest of the device and using that isolated portion as the sensing resistor region 1610. The first level via layer 1600 in FIGS. 16 and 17 includes a zero level metal layer comprising source fingers, drain fingers, gate fingers, and gate pads. The vias of the first level via layer are disposed on the source fingers, drain fingers, and gate pads.

FIG. 17 is an enlargement of a sensing resistor region 1610 of FIG. 16. In the sensing resistor example of FIG. 17, four short segments 1704 of the larger device's gate periphery are a part of a sensing area 1710 having a width of $W_s$, and may be isolated from the rest of the device by breaking the (in this case) two metal source fingers 1702A. The break may be created by either etching or implanting to produce a non-conductive region 1714 between the separated channel segments 1702B and the rest of the device.

Note that outside of the sensing area 1710, current flows through the drain finger vias 1716 to the drain fingers 1706, then through channels 1704 (between the source fingers 1702A and adjacent drain fingers 1706) to source fingers 1702A, back up through the first level source vias 1712A, and eventually to electrical ground. Inside the sensing area 1710, on the other hand, current flows through the drain finger vias 1716 to the drain fingers 1706, then through channels 1704 (between the source fingers 1702B and adjacent drain fingers 1706) to source fingers 1702B, back up through the first level source vias 1712B, and eventually to electrical ground through a sensing resistor $R_{ext}$ in FIG. 24.

FIGS. 16-23 illustrate the stages of the process for fabricating both the full dual-phase device and the sensing area. These stages are exemplary and more or fewer stages may occur during fabrication of the devices.

FIG. 16 illustrates a first level via layer 1600 for the dual phase gFET™ switch fabric with sensing resistor region 1610. FIG. 17 is an enlargement of a sensing resistor region 1610 in FIG. 16. The first level via layer 1600 of FIGS. 16 and 17 includes electrodes 1602 comprising zero level metal source fingers, drain fingers and gate pads. Electrical contact may be provided to the zero level metal electrodes 1602 by means of a plurality of first level vias 1601.

FIG. 18 illustrates a first level metal layer 1800 for the dual phase gFET™ switch fabric with sensing resistor region 1810. FIG. 19 is an enlargement of a sensing resistor region 1810 in FIG. 18. The first level metal layer 1800 of FIGS. 18 and 19 includes metal electrodes 1802 electrically coupled through the first level vias 1601 of the first level via layer 1600 to source fingers, drain fingers, and gate pads of the zero level metal layer. While an exemplary metal electrode 1802 is indicated in each of FIGS. 18 and 19 the first level metal layer 1800 includes a plurality of metal electrodes 1802.

FIG. 20 illustrates a second level via layer 2000 of the dual phase gFET™ switch fabric with sensing resistor region 2010. FIG. 21 is an enlargement of a sensing resistor region 2010 in FIG. 20. The second level via layer 2000 includes vias 2001-2009 disposed on the metal electrodes 1802 of the first level metal layer 1800. While exemplary vias 2001-2009 are indicated in each of FIGS. 20 and 21 the second level via layer 2000 includes plurality of vias 2001-2009.

FIG. 22 illustrates a second level metal layer 2200 of the dual phase gFET™ switch fabric with sensing resistor region 2210. FIG. 23 is an enlargement of a sensing resistor region 2210 in FIG. 22. The second level metal layer 2200 of FIGS. 22 and 23 includes metal electrodes 2201-2209 electrically coupled through the vias 2001-2009, respectively, of the second level via layer 2000 to the metal electrodes 1802 of the first level metal layer 1800. The vias 2001-2009 are illustrated using dotted lines in FIGS. 22 and 23 to indicate that they are disposed between the metal electrodes 2201-2209 of the second level metal layer 2200 and the metal electrodes 1802 of the first level metal layer 1800.

As shown in FIG. 19 the first level source vias 1712A are connected to first level metal fingers 1903. The first level source vias 1712B in the sensing area 1710, however, are connected to a separate first level metal finger 1902.

As shown in FIGS. 20-23 the second level metal fingers 2201-2209 are connected through vias 2001-2009, respectively, to the first level metal fingers. Specifically, second level metal fingers 2207 and 2209 are connected through vias 2007 and 2009, respectively, to the first level metal fingers 1903 and 1902, respectively. That is, the second level metal fingers 2209 are connected through vias 2009 to the first level metal fingers 1902 and then through the first level vias 1712B to the source fingers 1702B in the sensing area 1710. Similarly, the second level metal fingers 2208 are connected through vias 2008 to the first level metal fingers 1903 and then through the first level vias 1712A to the source fingers 1702A outside the sensing area 1710.

Figure 24:
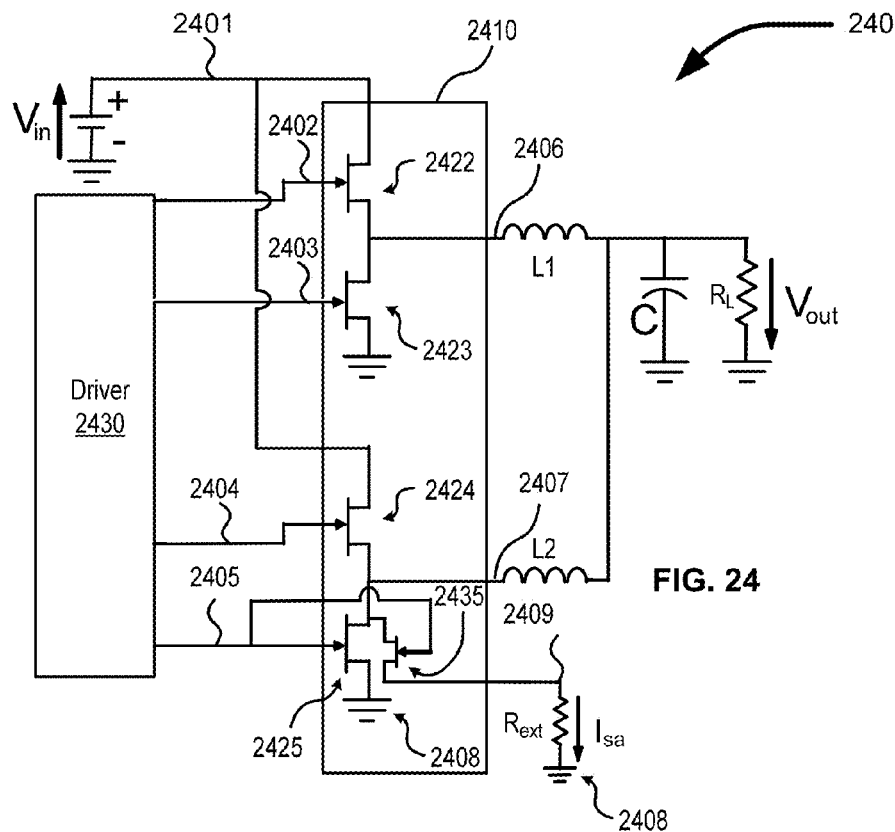
FIG. 24 illustrates a circuit diagram showing the sense resistor of the dual phase gFET™ switch fabric illustrated in FIGS. 16-23.

It can be seen that the only current that flows through second level metal finger 2209 to the sensing resistor $R_{ext}$ in FIG. 24 comes from channels 1704 adjacent to a portion or segment of the drain finger 1706 that is disposed within the sensing region 1710 (between source fingers 1702B), and from the two channels 1704 between the source fingers 1702B and the portion of drain fingers 1706 outside sensing area 1710 which are adjacent to source fingers 1702B. In FIG. 17 there are 4 such segments of channels 1704. Note that a channel is a region between a source finger and a drain finger where the gate finger is placed.

The non-conductive region 1714 of FIGS. 16-23 illustrates a break between two metal source fingers 1702A and two source fingers 1702B which are disposed in the sensing area 1710. However, the non-conductive region 1714 may be configured to separate more or fewer metal source fingers 1702A from metal source fingers 1702B, and more or fewer source fingers 1702B may be disposed in the sensing area 1710.

Figure 25:
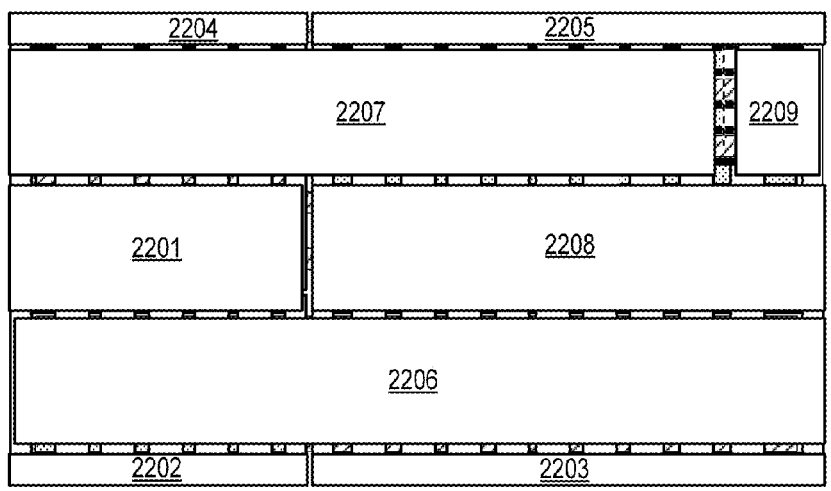
FIG. 25 illustrates the node layout on the second level metal layer of dual phase gFET™ switch fabric corresponding to the nodes in FIG. 24.

FIG. 24 illustrates a circuit diagram 2400 showing the sense resistor of the dual phase gFET™ switch fabric illustrated in FIGS. 16-23. FIG. 25 illustrates the node layout 2500 on the second level metal layer 2200 of dual phase gFET™ switch fabric corresponding to the nodes in FIG. 24.

The device circuit 2400 includes a dual phase converter including a first and second FET pair. The first FET pair comprises a control switch 2422 and sync switch 2423. The second FET pair comprises a control switch 2424 and sync switch 2425. A sensing circuit 2435 may be fabricated as a component of the sync switch 2425.

A driver 2430 controls application of gate signals to control gate 2402, sync gate 2403, control gate 2404, and sync gate 2405. An output 2406 from the first FET pair may be applied to inductor L1, which may be coupled to capacitor C and load resister $R_L$. An output 2407 from the second FET pair may be applied to inductor L2, which may also be coupled to capacitor C and load resister $R_L$.

The electrodes in the second level metal layer 2200 of FIG. 22 have been labeled in FIGS. 22, 23, and 25 to correspond with the circuit 2400 of FIG. 24. The electrodes 2201-2209 of FIGS. 22 and 25 correspond to the components of the circuit 2400. Electrode 2201 may apply $V_{in}$ signal 2401 to switch 2422 of the first FET pair and to switch 2424 of the second FET pair. Electrode 2202 may receive a gate signal 2402 for control switch 2422. Electrode 2203 may receive a gate signal 2403 for sync switch 2423. Electrode 2204 may receive a gate signal 2404 for control switch 2424. Electrode 2205 may receive a gate signal 2405 for sync switch 2425 and the sense switch 2435. Electrode 2201 may receive $V_{in}$ 2401. Electrode 2208 may provide a ground reference for ground 2408. Electrode 2209 may provide a sense signal 2409 as described elsewhere herein. Electrode 2206 may communicate output 2406 from the first FET pair to a load, e.g., via inductor L1. Electrode 2207 may communicate output 2407 from the second FET pair to the load, e.g., via inductor L2.

The current flowing through the sensing portion 2435 ($I_{sa}$) in the device circuit 2400 (illustrated in FIGS. 16-25) may be determined by measuring a voltage drop across an external resistor $R_{ext}$ in FIG. 24. The current $I_{sa}$ flowing through the sense device 2435 may be represented by the relation:

$$I_{sa} = \frac{V_{ext}}{R_{ext}}$$

where $V_{ext}$ is a voltage measured at 2409 across the sense resistor $R_{ext}$. "$I_t$" may represent the current flowing through the sync device 2425. Thus, a ratio of the current flowing through the sense device 2435 to the current flowing through the sync switch device 2425 is:

$$\frac{I_{sa}}{I_t}$$

Because the sensing area is an integral part of the overall device 1513, and is in intimate proximity to the device 1513, a ratio of the current flowing through the sensing area portion of the device ($I_{sa}$) and the current flowing through the remainder of the device ($I_t$) may be equal to a ratio of the total gate periphery of the sensing region ($W_{sa}$) to the area of the total gate periphery ($W_t$) of the remainder of device 1513 which is the sync switch 2425, or:

$$\frac{I_{sa}}{I_t} = \frac{W_{sa}}{W_t}$$

The gate periphery of the sensing region is:

$$W_{sa} = nW_s$$

where n is the number of channels or gate fingers in the sensing area (which is 4 in the example shown in FIGS. 16-25). Thus the current in the sync switch 2425 is:

$$I_t = I_{sa}\frac{W_t}{W_{sa}} = I_{sa}\frac{W_t}{nW_s}$$

Consider the following example: A sync device in a quad gFET™ switch fabric has a total gate periphery (including the gate periphery $W_{sa}$ in the sensing area) of 200 mm. A gate periphery $W_{sa}$ of 0.4 mm or 400 micron ($W_s$=100 microns; n=4) is segmented from the rest of the device as the sensing area. Note that this sensing area represents about 0.2% (or about 0.4 mm/200 mm) of the total device gate periphery, which may be a rather negligible portion. In operation, a voltage of 0.500 volts may be measured across a 100 ohm external sense resistor implying that $I_{sa}$ is equal to about 5.000 mA. Since $W_g$ is about 199.6 mm (200 mm less $W_{sa}$), then the current $I_t$ is equal to about 5.000×199.6÷0.4, or 2.495 A.

Since $R_{ext}$ is not in series with the majority of the current going through the converter circuit 2400, it can have a reasonably large value without adversely impacting the converter circuit's efficiency. The large sense resistance may result in a relatively easy and accurate current measurement.

While the sensing resistor region 2435 is illustrated in FIGS. 16-25 as being disposed in the sync switch 2425, the sensing resistor region 2435 may be disposed in any combination of switches 2422, 2423, 2424, and 2425. Further, the sensing resistor region 2435 may disposed in other single or multi-switch configurations. However, if the current in an upper switch is to be sensed, the sensing circuit (including the sensing area) will be between the input node and the switching node rather than between the switching node and ground as in the case shown above.

In summary, FIGS. 16-25 illustrate a non-conductive region isolating a sensing area from the rest of the switch FET (in this example the lower sync switch FET). The isolated section may have a total gate periphery of $W_{sa}$. Generally:

$$W_{sa} \ll W_t$$

where $W_t$ is the total gate periphery of the switch FET less $W_{sa}$.

If the total current in the sensing FET device is $I_{sa}$, then the current flowing through the switch FET device 2425 ($I_t$) may be represented as:

$$I_t = I_{sa} \frac{W_t}{W_{sa}}$$

The current "$I_{sa}$" may be determined by measuring the voltage across an external resistor $R_{ext}$ of FIG. 24. This then allows the current "$I_t$" to be calculated as discussed above.

The same approach can be used for sensing the current in a control FET except that the sense resistor is between the sensing node and the switching node, not ground.

The sensing resistor area described with respect to FIGS. 15-25 may be integrated into devices that include the internal e-Mode Protect Switch 919 described elsewhere herein with respect to FIGS. 9-14. The sensing resistor area described with respect to FIGS. 15-25 may be integrated into devices that include the integrated dual switch device 112, described elsewhere herein with respect to FIGS. 2-7.

Figure 26:
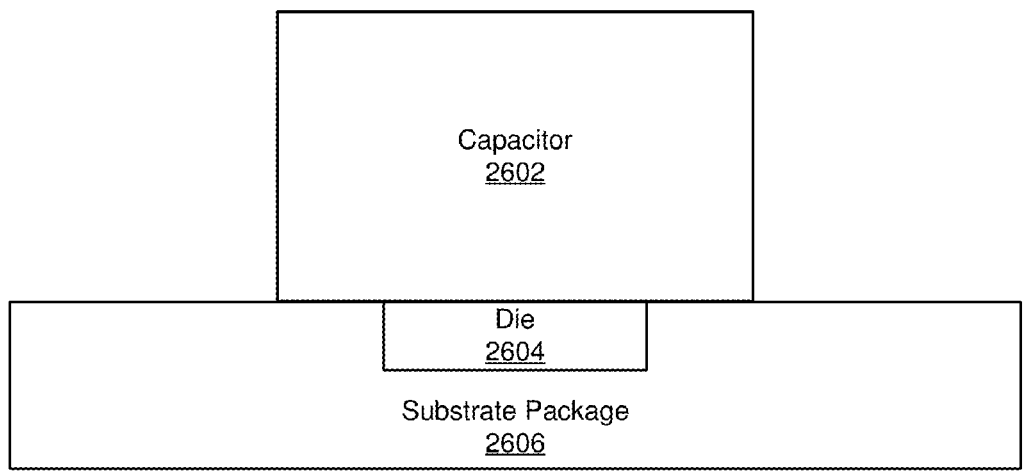
FIG. 26 is a block diagram illustrating a capacitor mounted directly above a die that is embedded in a package substrate.

In some embodiments, loop inductance may be reduced using a decoupling capacitor. FIG. 26 illustrates a capacitor mounted directly above a die. The embodiment illustrated in FIG. 26 relates to techniques employed to reduce voltage noise in electrical circuits. Specifically, the configuration of a package may contain one or more semiconductor die and one or more bypass capacitors that are included to reduce voltage noise.

As electronics have continued to evolve to smaller and more advanced process nodes, signal rise times continue to decrease giving rise to ever more issues with the integrity of signals and the power system.

The power delivery network (PDN) of a power management circuit carries the highest currents. It is composed of the largest conducting structures, and has the potential to create the biggest issues with EMI (ElectroMagnetic Interference). The voltage drop generated may be represented by the expression V=L di/dt where L is the loop inductance as seen by the die from its power to ground nodes, di is the transient current, and dt is the time interval over which the transient current exists.

The voltage drop may be minimized using a number of methods.

1. Through careful design the di term can be minimized to some extent—for example by incrementally turning on a large number of output buffers instead of all at once.
2. The amount of on die capacitance between power and ground can be increased at the expense of added process complexity and hence yield loss. This has the effect of increasing the dt term.
3. The inductance can be decreased in a number of ways:
   a. Using wide planes to route from the voltage source to the die.
   b. Minimizing the spacing between the power planes and utilizing high k dielectrics which have the effect of lowering the inductance and also increasing the capacitance.
   c. By placing decoupling/bypass capacitors as close as possible to the power and ground connections of the die.

Generally all of these methods are employed to various degrees. However, applications of one or more of these methods do not satisfy the demands of many systems. As a result, performance tends to be reduced. Particularly challenging are power systems such as switch mode power supply chips. It is a goal for switch mode power supply chips to provide large currents in short time frames, while ideally occupying a small footprint. What is needed for these systems is a way to apply large capacitances very close to the die.

FIG. 26 is a block diagram illustrating a capacitor 2602 mounted directly above a die 2604 that is embedded in a package substrate 2606. The decoupling capacitor of FIG. 26 is directly above the die. This may be accomplished by embedding the die 2604 within a package substrate 2606 and placing the capacitor 2602 directly above the die on the substrate surface as illustrated in FIG. 26. A resulting reduction in the loop inductance may be limited by the dimensions related to decoupling of the capacitor 2602 and the die 2604. Present technology allows for a total thickness of the substrate to be as thin as 240 microns, which allows the capacitor 2602 to be disposed about 25 microns above the die 2604. The capacitor 2602 may be separated from the die 2604 by an organic material, which may provide stress relief to the substrate. In this configuration the ESL (Equivalent Series Inductance) of the capacitor 2602 may become a dominate term of the total inductance instead of the interconnect inductance, and the interconnect inductance may become negligible. The overall inductance can be reduced by utilizing a low ESL capacitor.

In some embodiments, the position of the die 2604 and capacitor 2602 may be switched, for example when using a thin capacitor 2602. In some embodiments, multiple die 2604 may be embedded on top of each other in the package 2606. Thus, the capacitor 2602 may bypass more than one die 2604.

In various embodiments, the die 2604 may be fabricated to incorporate devices that include the sensing resistor area described elsewhere herein with respect to FIGS. 15-25; devices that include the internal e-Mode Protect Switch 919 described elsewhere herein with respect to FIGS. 9-14; and devices that include the integrated dual switch device 112, described elsewhere herein with respect to FIGS. 2-7.

As used in this specification, the terms "include," "including," "for example," "exemplary," "e.g.," and variations thereof, are not intended to be terms of limitation, but rather are intended to be followed by the words "without limitation" or by words with a similar meaning. Definitions in this specification, and all headers, titles and subtitles, are intended to be descriptive and illustrative with the goal of facilitating comprehension, but are not intended to be limiting with respect to the scope of the inventions as recited in the claims. Each such definition is intended to also capture additional equivalent items, technologies or terms that would be known or would become known to a person having ordinary skill in this art as equivalent or otherwise interchangeable with the respective item, technology or term so defined. Unless otherwise required by the context, the verb "may" indicates a possibility that the respective action, step or implementation may be performed or achieved, but is not intended to establish a requirement that such action, step or implementation must be performed or must occur, or that the respective action, step or implementation must be performed or achieved in the exact manner described.

Figure 27:
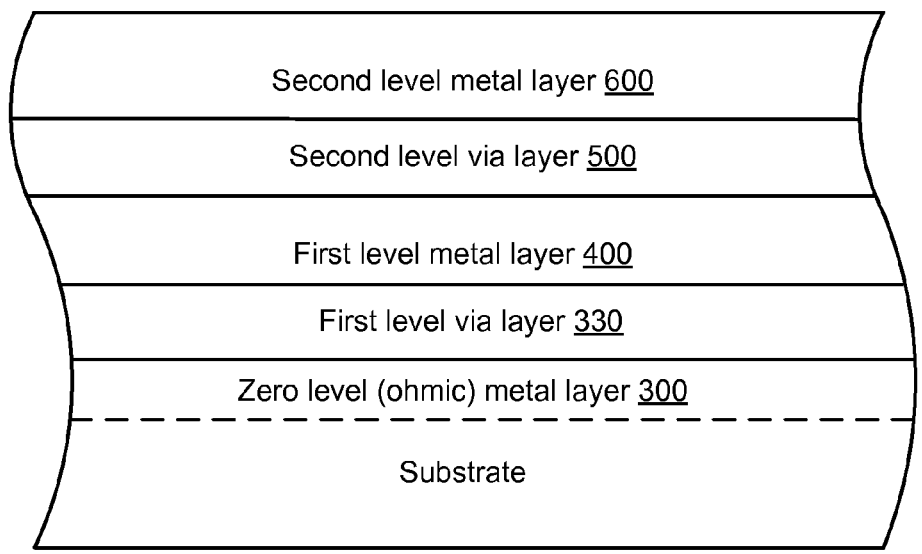
FIG. 27 is a cross section diagram illustrating an ohmic metal layer, via layers, and metal layers disposed on a substrate.

FIG. 27 is a cross section diagram illustrating an ohmic metal layer, via layers, and metal layers disposed on a substrate. The layers include a zero level (ohmic) layer 300, a first level via layer 330, a first level metal layer 400, a second level via layer 500, and a second level metal layer 600. The zero level ohmic layer 300 may be disposed on a semiconductor substrate. The first level via layer 330 may be disposed on the zero level metal layer 300. The first level via layer 330 includes vias 322, 326, and 332-340. In some embodiments, the first level via layer 330 includes a dielectric material. The first level metal layer 400 may be disposed above the first level via layer 330. As described elsewhere herein, the vias 322, 324, and 332-340 provide conduction between the zero level metal layer 300 and the first level metal layer 400. The second level via layer 500 may be disposed on the first level metal layer 400. In some embodiments, the second level via layer 500 includes a dielectric material. The second level metal layer 600 may be disposed above the second level via layer 500. As described elsewhere herein, vias included in the second level via layer 500 provide conduction between the first level metal layer 400 and the second level metal layer 600.

The above description is illustrative and not restrictive. This patent describes in detail various embodiments and implementations of the present invention and the present invention is open to additional embodiments and implementations, further modifications, and alternative constructions. There is no intention in this patent to limit the invention to the particular embodiments and implementations disclosed; on the contrary, this patent is intended to cover all modifications, equivalents and alternative embodiments and implementations that fall within the scope of the claims. Moreover, embodiments illustrated in the figures may be used in various combinations. Any limitations of the invention should, therefore, be determined not with reference to the above description, but instead should be determined with reference to the appended claims along with their full scope of equivalents.

What is claimed is:

1. A device comprising:
   a compound semiconductor layer;
   a plurality of ohmic metal lingers fabricated on the compound semiconductor layer, the ohmic metal fingers including a plurality of input fingers, a plurality of switch fingers and a plurality of ground fingers, the ohmic metal fingers disposed in a repeating pattern including a sequence of:
      input finger,
      switch finger,
      ground finger referenced to a ground, and
      switch finger;
   a plurality of control gates, at least one of the control gates disposed between each input finger and adjacent switch finger;
   a plurality of sync gates, at least one of the sync gates disposed between each ground finger and adjacent switch finger, at least one of the sync gates and at least one of the control gates adjacent each switch finger;
   a plurality of control gate pads, each control gate pad disposed at an end of two control gates, and at least one of the control gate pads at opposite ends of each control gate;
   a plurality of sync gate pads, each sync gate pad disposed at an end of two sync gates, and at least one sync gate pad at opposite ends of each sync gate; and
   a first metallic layer of parallel metal electrodes including:
      a plurality of input electrodes, each input electrode electrically coupled to the plurality of input fingers through one or more vias disposed on each of the input fingers;
      a plurality of switch electrodes, each switch electrode electrically coupled to the plurality of switch fingers through one or more vias disposed on each of the switch fingers; and
      a plurality of ground electrodes, each ground electrode electrically coupled to the plurality of ground fingers through one or more vias disposed on each of the ground fingers.

2. The device of claim 1, further comprising at least one control gate pad disposed between at least one of the sync gate pads and at least one of the input fingers.

3. The device of claim 1, further comprising at least one sync gate pad disposed between at least one of the control gate pads and at least one of the ground fingers.

4. The device of claim 1, wherein tie plurality of metal electrodes are arrayed in a repeating pattern including a sequence of:
   input electrode;
   switch electrode;
   ground electrode; and
   switch electrode.

5. The device of claim 1, further comprising a second metallic layer for providing electrical communication to the electrodes of the first metallic layer, the second metallic layer comprising:
   an input electrode;
   a ground electrode;
   an output electrode; and
   a plurality of gate electrodes.

6. A device comprising:
   a compound semiconductor layer;
   a plurality of ohmic metal fingers fabricated on the compound semiconductor layer, the ohmic metal fingers including a plurality of input fingers, a plurality of switch fingers and a plurality of ground fingers, the ohmic metal fingers disposed in a repeating pattern including a sequence of:
      input finger,
      switch finger,
      ground finger referenced to a ground, and
      switch finger;
   a plurality of control gates, at least one of the control gates disposed between each input finger and adjacent switch finger;
   a plurality of sync gates, at least one of the sync gates disposed between each ground finger and adjacent switch finger, at least one of the sync gates and at least one of the control gates adjacent each switch finger;
   a plurality of control gate pads, each control gate pad disposed at an end of two control gates, and at least one of the control gate pads at opposite ends of each control gate;
   a plurality of sync gate pads, each sync gate pad disposed at an end of two sync gates, and at least one sync gale pad at opposite ends of each sync gate; and
   an e-mode FET configured as a normally off component to protect a control FET upon power up of the device, the control FET, sync FET and e-mode FET fabricated on the compound semiconductor layer as a monolithic device,
   the e-mode protection FET further comprising:

a plurality of first and second e-mode ohmic metal fingers, each of the first e-mode ohmic metal fingers contiguous with a first control ohmic metal finger of the control FET;
an e-mode gate finger disposed between each adjacent first e-mode ohmic metal finger and second e-mode ohmic metal finger; and
for each of the second e-mode ohmic metal fingers, an e-mode gate pad and a control gate pad disposed between the second e-mode ohmic metal lingers and a second control ohmic metal finger, the second control ohmic metal finger aligned with the second e-mode ohmic metal finger, each e-mode gate pad at an end of two e-mode gate fingers.

7. The device of claim 1, further comprising a sense area fabricated on the compound semiconductor layer, the sense area comprising:
a first sense ohmic metal finger parallel to and aligned with the ground finger;
a second sense ohmic metal finger contiguous with the switch finger;
a non-conductive region disposed between the first sense ohmic metal finger and the ground finger; and
a continuous sync gate finger disposed adjacent the first and second sense ohmic metal finger and between the ground linger and switch finger.

8. A device comprising:
a compound semiconductor layer;
a plurality of ohmic metal fingers including input fingers, switch fingers, and ground fingers referenced to a ground, the plurality of ohmic metal fingers fabricated on the compound semiconductor layer in a repeating pattern;
a plurality of control gates, at least one of the control gates disposed between each input finger and at least one switch finger adjacent to the input finger;
a plurality of sync gates, at least one sync gate disposed between each ground finger and at least one switch finger adjacent to the ground finger, at least one sync gate and at least one control gate adjacent each switch finger;
a plurality of control gate pads, each control gate pad disposed at an end of two control gates, and at least one control gate pad disposed at opposite ends of each control gate;
a plurality of sync gate pads, each sync gate pad at an end of two sync gates, and at least one sync gate pad disposed at opposite ends of each sync gate; and
a first metallic layer of parallel metal electrodes including:
a plurality of input electrodes, each input electrode electrically coupled to a plurality of input fingers through one or more vias disposed on each of the input fingers;
a plurality of switch electrodes, each switch electrode electrically coupled to a plurality of switch fingers through one or more vias disposed on each of the switch fingers; and
a plurality of ground electrodes, each ground electrode electrically coupled to a plurality of ground fingers through one or more vias disposed on each of the ground fingers.

9. The device of claim 8, wherein tie repeating pattern includes a sequence of:
input finger;
switch finger;
ground finger referenced to a ground; and
switch finger.

10. The device of claim 8, further comprising a control gate pad disposed between a sync gate pad and an input finger.

11. The device of claim 8, further comprising a sync gate pad disposed between a control gate pad and a ground finger.

12. The device of claim 8, wherein tie plurality of metal electrodes are arrayed in a repeating pattern including a sequence of:
input electrode;
switch electrode;
ground electrode; and
switch electrode.

13. The device of claim 8, further comprising a second metallic layer for providing electrical communication to the electrodes of the first metallic layer, the second metallic layer comprising:
an input electrode;
a ground electrode;
an output electrode; and
a plurality of gate electrodes.

14. The device of claim 8, wherein the repeating pattern includes a sequence
input finger;
switch finger;
ground finger;
switch finger;
ground finger,
switch finger;
ground finger; and
switch finger.

* * * * *